United States Patent
Ootsuka et al.

(10) Patent No.: US 9,893,407 B2
(45) Date of Patent: *Feb. 13, 2018

(54) DIRECTIONAL COUPLER

(71) Applicant: TDK CORPORATION, Tokyo (JP)

(72) Inventors: Noriaki Ootsuka, Tokyo (JP); Takeshi Kijima, Tokyo (JP); Yasunori Sakisaka, Tokyo (JP)

(73) Assignee: TDK CORPORATION, Tokyo (JP)

(*) Notice: Subject to any disclaimer, the term of this patent is extended or adjusted under 35 U.S.C. 154(b) by 17 days.

This patent is subject to a terminal disclaimer.

(21) Appl. No.: 15/187,922

(22) Filed: Jun. 21, 2016

(65) Prior Publication Data

US 2017/0033428 A1    Feb. 2, 2017

(30) Foreign Application Priority Data

Jul. 29, 2015  (JP) .................. 2015-149280

(51) Int. Cl.
| | |
|---|---|
| H01P 5/18 | (2006.01) |
| H03H 7/38 | (2006.01) |
| H03H 7/48 | (2006.01) |
| H03H 1/00 | (2006.01) |

(52) U.S. Cl.
CPC ............ *H01P 5/18* (2013.01); *H01P 5/187* (2013.01); *H03H 7/48* (2013.01); *H03H 2001/0085* (2013.01)

(58) Field of Classification Search
CPC ............ H01P 5/18; H01P 5/185; H03H 7/185

USPC .......................................... 333/109–112, 116
See application file for complete search history.

(56) References Cited

U.S. PATENT DOCUMENTS

| | | | |
|---|---|---|---|
| 9,077,061 B2 | 7/2015 | Tamaru | |
| 9,385,411 B2* | 7/2016 | Ohashi | H01P 5/187 |
| 9,391,354 B2* | 7/2016 | Ootsuka | H01P 5/185 |
| 9,413,324 B2* | 8/2016 | Tanaka | H03H 7/0115 |
| 9,653,771 B2* | 5/2017 | Ootsuka | H01P 5/184 |
| 2017/0040661 A1* | 2/2017 | Ashida | H01P 5/18 |
| 2017/0214109 A1* | 7/2017 | Ashida | H01P 5/18 |

FOREIGN PATENT DOCUMENTS

JP        2014-057207 A    3/2014

* cited by examiner

*Primary Examiner* — Dean Takaoka
(74) *Attorney, Agent, or Firm* — Oliff PLC

(57) ABSTRACT

A directional coupler includes: a main line connecting a first port and a second port; first to third subline sections each of which is formed of a line configured to be electromagnetically coupled to the main line; a first matching section provided between the first subline section and the second subline section; a second matching section provided between the second subline section and the third saline section; and a stack for integrating these components. The stack includes a plurality of dielectric layers and a plurality of conductor layers stacked on each other. Each of the first and second matching sections includes two inductors each formed using one or more of the conductor layers, and a capacitor formed using two or more of the conductor layers.

6 Claims, 15 Drawing Sheets

DIRECTIONAL COUPLER

BACKGROUND OF THE INVENTION

1. Field of the Invention The present invention relates to a wideband capable directional coupler.

2. Description of the Related Art

Directional couplers are used for detecting the levels of transmission/reception signals in transmission/reception circuits of wireless communication apparatuses such as cellular phones and wireless LAN communication apparatuses.

A directional coupler configured as follows is known as a conventional directional coupler. The directional coupler has an input port, an output port, a coupling port, a terminal port, a main line, and a subline. One end of the main line is connected to the input port, and the other end of the main line is connected to the output port. One end of the subline is connected to the coupling port, and the other end of the subline is connected to the terminal port. The main line and the subline are configured to be electromagnetically coupled to each other. The terminal port is grounded via a terminator having a resistance of, for example, 50 Ω. The input port receives a high frequency signal, and the output port outputs the same. The coupling port outputs a coupling signal having a power that depends on the power of the high frequency signal received at the input port.

Major parameters indicating the characteristics of directional couplers include insertion loss, coupling, isolation, directivity, and return loss at the coupling port. Definitions of these parameters will now be described. First, assume that the input port receives a high frequency signal of power P1. In this case, let P2 be the power of the signal output from the output port, P3 be the power of the signal output from the coupling port, and P4 be the power of the signal output from the terminal port. Assuming that the output port receives a high frequency signal of power P02, let P03 be the power of the signal output from the coupling port. Assuming that the coupling port receives a high frequency signal of power P5, let P6 be the power of the signal reflected at the coupling port. Further, let IL represent insertion loss, C represent coupling, I represent isolation, D represent directivity, and RL represent return loss at the coupling port. These parameters are defined by the following equations.

$IL = 10 \log (P2/P1)$ [db]

$C = 10 \log (P3/P1)$ [db]

$I = 10 \log (P03/P02)$ [dB]

$D = 10 \log (P4/P3)$ [dB]

$RL = 10 \log (P6/P5)$ [dB]

The coupling of the conventional directional coupler increases with increasing frequency of the high frequency signal received at the input port. The conventional directional coupler thus suffers from the problem that the frequency response of the coupling is not flat. Where coupling is denoted as −c (dB), an increase in coupling means a decrease in the value of c.

U.S. Pat. No. 9,077,061 B2 discloses a directional coupler aiming to resolve the aforementioned problem. The directional coupler disclosed therein has a subline divided into a first subline and a second subline. One end of the first subline is connected to the coupling port. One end of the second subline is connected to the terminal port. A phase conversion unit is provided between the other end of the first subline and the other end of the second subline. The phase conversion unit causes a phase shift to be generated in a signal passing therethrough in such a manner that the absolute value of the phase shift monotonically increases within the range from 0 degree to 180 degrees as the frequency increases in a predetermined frequency band. The phase conversion unit is specifically a low-pass filter.

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a wideband capable directional coupler, that is, a directional coupler usable for multiple signals in multiple frequency bands.

Directional couplers for use in wireless communication apparatuses are sometimes expected to be bidirectional, that is, to exhibit the same characteristics even when used with the input port and the output port reversed and with the coupling port and the terminal port reversed, as compared with when used without reversing them. Examples of situations requiring bidirectionality include when a directional coupler provided in a transmission circuit for supplying a transmission signal to an antenna is used to detect the level of the transmission signal and also the level of a reflected wave signal resulting from the transmission signal reflected at the antenna. The detection of the level of the reflected wave signal by the directional coupler is for the purpose of adjusting the characteristics of an impedance matching element provided between the transmission circuit and the antenna so as to sufficiently reduce the level of the reflected wave signal. In the aforementioned example, when the directional coupler detects the level of a transmission signal, the transmission signal is received at the input port and output from the output port, and the coupling port outputs a signal having a power that depends on the level of the transmission signal. On the other hand, when the directional coupler detects the level of a reflected wave signal, the reflected wave signal is received at the output port and output from the input port, and the terminal port outputs a signal having a power that depends on the level of the reflected wave signal.

JP 2014-057207A discloses a directional coupler that is wideband capable and bidirectional. In the directional coupler disclosed in JP 2014-057207A, the subline includes a first coupling section having strong coupling to the main line, a second coupling section having weak coupling to the main line and located closer to the coupling port than the first coupling section, a third coupling section having weak coupling to the main line and located closer to the isolation port (terminal port) than the first coupling section, a first non-coupling section not coupled to the main line, extending between the first and second coupling sections and having a length of a quarter or more of a wavelength corresponding to the service frequency band, and a second non-coupling section not coupled to the main line, extending between the first and third coupling sections and having a length of a quarter or more of the wavelength corresponding to the service frequency band.

The directional coupler disclosed in U.S. Pat. No. 9,077,061 B2 has insufficient isolation in a frequency band not lower than the cut-off frequency of the low-pass filter. More specifically, where isolation is denoted as −i (dB), this directional coupler does not exhibit a sufficiently large value of i in a frequency band not lower than the cut-off frequency of the low-pass filter. Thus, this directional coupler does not work in a frequency band not lower than the cut-off frequency of the low-pass filter.

We proceed to explain why the directional coupler disclosed in U.S. Pat. No. 9,077,061 B2 does not exhibit sufficiently large value of i in a frequency band not lower than the cut-off frequency of the low-pass filter. In this directional coupler, there are formed a path connecting the connection point between the first subline and the low-pass filter to the ground via only a first capacitor, and a path connecting the connection point between the second subline and the low-pass filter to the ground via only a second capacitor. Consequently, in a frequency band not lower than the cut-off frequency of the low-pass filter, a high frequency signal going from the first sublime to the low-pass filter mostly flows to the ground via the first capacitor, and a high frequency signal going from the second subline to the low-pass filter mostly flows to the ground via the second capacitor. Thus, in this directional coupler, most part of the high frequency signal fails to pass through the low-pass filter in a frequency band not lower than the cut-off frequency of the low-pass filter.

For the reason described above, the directional coupler disclosed in U.S. Pat. No. 9,077,061 B2 is only usable over a limited frequency band lower than the cut-off frequency of the low-pass filter. Providing a wideband capable directional coupler is thus difficult with the technology described in U.S. Pat. No. 9,077,061 B2.

In the directional coupler disclosed in JP 2014-057207A, the subline includes the first and second non-coupling sections each having a length of a quarter or more of the wavelength corresponding to the service frequency band. The two non-coupling sections are each extremely long. For example, if the service frequency is 3 GHz, then the wavelength is 10 cm and the length of each of the two coupling sections is 2.5 cm or more. In JP 2014-057207A, each of the two non-coupling sections is formed of a long and narrow spiral line. Because of the two extremely long non-coupling sections, the directional coupler disclosed in JP 2014-057207A is disadvantageously large in footprint.

OBJECT AND SUMMARY OF THE INVENTION

It is an object of the present invention to provide a directional coupler that is wideband capable and bidirectional, and has a reduced footprint.

A directional coupler of the present invention includes a first port, a second port, a third port, a fourth port, a main line connecting the first port and the second port, a first, a second and a third subline section each of which is formed of a line configured to be electromagnetically coupled to the main line, and a first and a second matching section.

The first to third subline sections and the first and second matching sections each have a first end and a second end opposite to each other. The first end of the first subline section is connected to the third port. The first end of the first matching section is connected to the second end of the first subline section. The first end of the second subline section is connected to the second end of the first matching section. The first end of the second matching section is connected to the second end of the second subline section. The first end of the third subline section is connected to the second end of the second matching section. The second end of the third subline section is connected to the fourth port.

Each of the first and second matching sections causes a change in the phase of a signal passing therethrough. Each of the first and second matching sections includes a first path connecting the first end and the second end of the matching section, and a second path connecting the first path and the ground. The first path includes a first inductor. The second path includes a first capacitor and a second inductor connected in series.

The directional coupler of the present invention may further include a stack for integrating the first to fourth ports, the main line, the first to third sublines, and the first and second matching sections. The stack includes a plurality of dielectric layers and a plurality of conductor layers stacked on each other. Each of the first and second inductors may be foimed using one or more conductor layers among the plurality of conductor layers. The first capacitor may be formed using two or more conductor layers among the plurality of conductor layers.

In the directional coupler of the present invention, the strength of coupling of the second subline section to the main line may be higher than the strength of coupling of the first subline section to the main line and the strength of coupling of the third subline section to the main line.

In the directional coupler of the present invention, the first inductor may have a first end and a second end opposite to each other, and the second inductor may have a first end and a second end, the first end being closest to the first path in terms of circuitry, the second end being closest to the ground in terms of circuitry. The first capacitor may be provided between the first end of the first inductor and the first end of the second inductor. In this case, the second path may further include a second capacitor provided between the second end of the first inductor and the first end of the second inductor.

In the directional coupler of the present invention, the first path may further include a third inductor connected to the first inductor in series. In this case, the second inductor may have a first end and a second end, the first end being closest to the first path in terms of circuitry, the second end being closest to the ground in terms of circuitry. The first capacitor may be provided between the first end of the second inductor and the connection point between the first inductor and the third inductor, In the directional coupler of the present invention, the second inductor may have an inductance of 0.1 nH or higher.

The present invention provides a directional coupler with wideband capability and bidirectionality by constructing the directional coupler to include the first to third subline sections and the first and second matching sections, The directional coupler of the present invention eliminates the need for a line having a length of a quarter or more of the wavelength of a high frequency signal. The directional coupler of the present invention thus achieves a reduced footprint, in addition to the wideband capability and bidirectionality.

Other and further objects, features and advantages of the invention will appear more fully from the following description.

DETAILED DESCRIPTION OF THE PREFERRED EMBODIMENTS

First Embodiment

Figure 1:
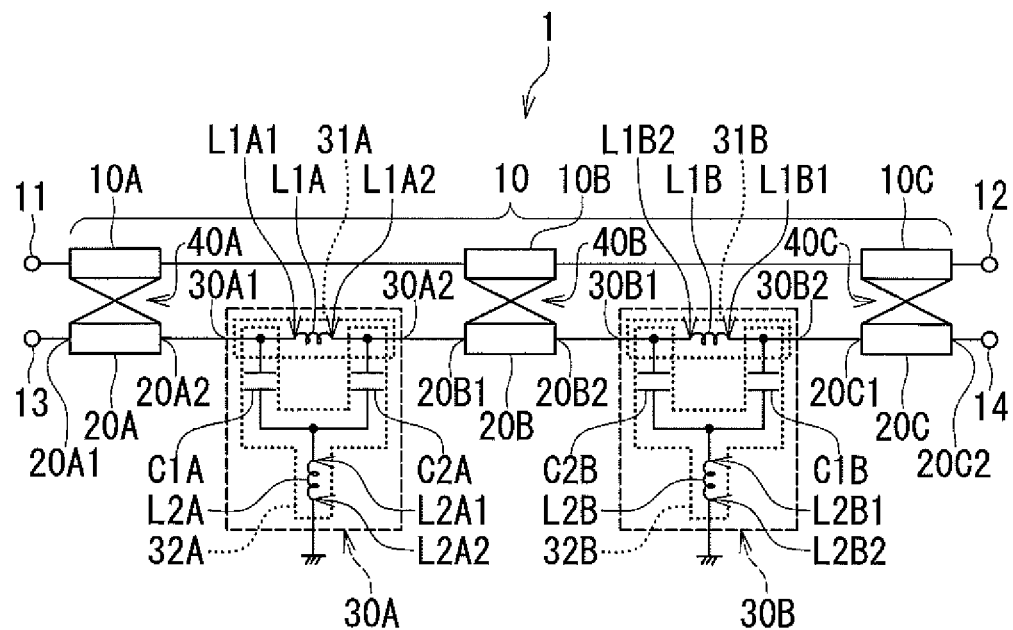
FIG. 1 is a circuit diagram illustrating the circuitry of a directional coupler according to a first embodiment of the invention.

Preferred embodiments of the present invention will now be described in detail with reference to the drawings. First, reference is made to FIG. 1 to describe the circuitry of a directional coupler according to a first embodiment of the invention. As shown in FIG. 1, the directional coupler 1 according to the first embodiment includes a first port 11, a second port 12, a third port 13, and a fourth port 14. The directional coupler 1 further includes a main line 10, a first subline section 20A, a second subline section 20B, a third subline section 20C, a first matching section 30A, and a second matching section 30B. The main line 10 connects the first port 11 and the second port 12. Each of the first to third subline sections 20A, 20B and 20C is formed of a line configured to be electromagnetically coupled to the main line 10. One of the third and fourth ports 13 and 14 is grounded via a terminator 15 having a resistance of, for example, 50 Ω.

The first subline section 20A has a first end 20A1 and a second end 20A2 opposite to each other. The second subline section 20B has a first end 20B1 and a second end 20B2 opposite to each other. The third subline section 20C has a first end 20C1 and a second end 20C2 opposite to each other. The first matching section 30A has a first end 30A1 and a second end 30A2 opposite to each other. The second matching section 30B has a first end 30B1 and a second end 30B2 opposite to each other.

The first end 20A1 of the first subline section 20A is connected to the third port 13. The first end 30A1 of the first matching section 30A is connected to the second end 20A2 of the first subline section 20A. The first end 20B1 of the second subline section 20B is connected to the second end 30A2 of the first matching section 30A. The first end 30B1 of the second matching section 30B is connected to the second end 20B2 of the second subline section 20B. The first end 20C1 of the third subline section 20C is connected to the second end 30B2 of the second matching section 30B. The second end 20C2 of the third subline section 20C is connected to the fourth port 14.

The first matching section 30A includes a first path 31A connecting the first end 30A1 and the second end 30A2, and a second path 32A connecting the first path 31A and the ground. The first path 31A includes a first inductor L1A. The first inductor L1A has a first end L1A1 and a second end L1A2 opposite to each other. Here, of the two ends of the first inductor L1A, the first end L1A1 is taken as the end closer to the first subline section 20A, whereas the second end L1A2 is taken as the end closer to the second subline section 20B.

The second path 32A includes a first capacitor C1A and a second inductor L2A connected in series. The second inductor L2A has a first end L2A1 and a second end L2A2. In terms of circuitry, the first end L2A1 is closest to the first path 31A, and the second end L2A2 is closest to the ground. The first capacitor C1A is provided between the first end L1A1 of the first inductor L1A and the first end L2A1 of the second inductor L2A. In the first embodiment, the second path 32A further includes a second capacitor C2A provided between the second end L1A2 of the first inductor L1A and the first end L2A1 of the second inductor L2A. The second inductor L2A has an inductance of 0.1 nH or higher. The inductance of the second inductor L2A is preferably not higher than 7 nH.

The circuitry of the second matching section 30B is similar to that of the first matching section 30A. More specifically, the second matching section 30B includes a first path 31B connecting the first end 30B1 and the second end 30B2, and a second path 32B connecting the first path 31B and the ground. The first path 31B includes a first inductor L1B. The first inductor L1B has a first end L1B1 and a second end L1B2 opposite to each other. Here, of the two ends of the first inductor L1B, the first end L1B1 is taken as the end closer to the third subline section 20C, whereas the second end L1B2 is taken as the end closer to the second subline section 20B.

The second path 32B includes a first capacitor C1B and a second inductor L2B connected in series. The second inductor L2B has a first end L2B1 and a second end L2B2. In terms of circuitry, the first end L2B1 is closest to the first path 31B, and the second end L2B2 is closest to the ground. The first capacitor C1B is provided between the first end L1B1 of the first inductor L1B and the first end L2B1 of the second inductor L2B. In the first embodiment, the second path 32B further includes a second capacitor C2B provided between the second end L1B2 of the first inductor L1B and the first end L2B1 of the second inductor L2B. The second inductor L2B has an inductance of 0.1 nH or higher. The inductance of the second inductor L2B is preferably not higher than 7 nH.

The main line 10 includes a first portion 10A to be electromagnetically coupled to the first subline section 20A, a second portion 10B to be electromagnetically coupled to the second subline section 20B, and a third portion 10C to be electromagnetically coupled to the third subline section 20C. Here, a portion of the main line 10 to be coupled to the first subline section 20A, i.e., the first portion 10A, and the first subline section 20A in combination will be referred to as the first coupling section 40A. A portion of the main line 10 to be coupled to the second subline section 20B, i.e., the second portion 10B, and the second subline section 20B in combination will be referred to as the second coupling section 40B. A portion of the main line 10 to be coupled to the third subline section 20C, i.e., the third portion 10C, and the third subline section 20C in combination will be referred to as the third coupling section 40C.

The strength of coupling of the first coupling section 40A, the strength of coupling of the second coupling section 40B, and the strength of coupling of the third coupling section 40C will be defined as follows.

The strength of coupling of the first coupling section 40A is the strength of coupling of the first subline section 20A to the main line 10, that is, the strength of coupling of the first subline section 20A to the first portion 10A of the main line 10. Specifically, the strength of coupling of the first coupling section 40A is expressed in terms of a ratio of the power of a high frequency signal appearing on the first subline section 20A to the power of a high frequency signal supplied to the first portion 10A.

The strength of coupling of the second coupling section 40B is the strength of coupling of the second subline section 20B to the main line 10, that is, the strength of coupling of the second subline section 20B to the second portion 10B of the main line 10. Specifically, the strength of coupling of the second coupling section 40B is expressed in terms of a ratio of the power of a high frequency signal appearing on the second subline section 20B to the power of a high frequency signal supplied to the second portion 10B.

The strength of coupling of the third coupling section 40C is the strength of coupling of the third subline section 20C to the main line 10, that is, the strength of coupling of the third subline section 20C to the third portion 10C of the main line 10. Specifically, the strength of coupling of the third coupling section 40C is expressed in terms of a ratio of the power of a high frequency signal appearing on the third subline section 20C to the power of a high frequency signal supplied to the third portion 10C.

The strength of coupling of the second coupling section 40B may be higher than the strength of coupling of the first coupling section 40A and the strength of coupling of the third coupling section 40C.

Each of the first and second matching sections 30A and 30B is a circuit for performing impedance matching between a signal source and a load, assuming a situation in which one of the third and fourth ports 13 and 14 is grounded via a terminator serving as the load, and the other of the third and fourth ports 13 and 14 is connected with the signal source having an output impedance equal to the resistance of the terminator (e.g., 50Ω). On the assumption of the above situation, the first and second matching sections 30A and 30B are each designed so that the reflection coefficient as viewed in the direction from one of the third and fourth ports 13 and 14 to the other has an absolute value of zero or near zero in the service frequency band of the directional coupler 1. Each of the first and second matching sections 30A and 30B causes a change in the phase of a signal passing therethrough.

The circuitry of the directional coupler 1, including element values, is preferably symmetric with respect to the second coupling section 40B. However, the circuitry of the directional coupling 1 may be asymmetric if the degree of asymmetry is within an acceptable range.

In the following, we discuss the case where the circuitry of the directional coupler 1 is symmetric. In this case, the strength of coupling of the third coupling section 40C is equal to the strength of coupling of the first coupling section 40A. Further, the circuitry of the first matching section 30A and that of the second matching section 30B, including element values, are mutually symmetric with respect to the second coupling section 40B. More specifically, the inductances of the first inductors L1A and L1B pairing up with each other are substantially equal to each other; the inductances of the second inductors L2A and L2B pairing up with each other are substantially equal to each other; the capacitances of the first capacitors C1A and C1B pairing up with each other are substantially equal to each other; and the capacitances of the second capacitors C2A and C2B pairing up with each other are substantially equal to each other. When signals of the same frequency pass through the first and second matching sections 30A and 30B, the first and second matching sections 30A and 30B cause changes of the same magnitude in the phase of those signals. The directional coupler 1 is bidirectional because the circuitry thereof is symmetric with respect to the second coupling section 40B. As mentioned above, the inductances of two inductors pairing up with each other are "substantially equal to each other", and ditto for the capacitances of two capacitors pairing up with each other. This means that errors in the inductances and capacitances resulting from manufacturing variances of the inductors and capacitors are tolerated.

In the first matching section 30A shown in FIG. 1, the first capacitor C1A is provided between the first end L1A1 of the first inductor L1A and the first end L2A1 of the second inductor L2A, and the second capacitor C2A is provided between the second end L1A2 of the first inductor L1A and the first end L2A1 of the second inductor L2A. In the second matching section 30B shown in FIG. 1, the first capacitor C1B is provided between the first end L1B1 of the first inductor L1B and the first end L2B1 of the second inductor L2B, and the second capacitor C2B is provided between the second end L1B2 of the first inductor DB and the first end L2B1 of the second inductor L2B. However, in terms of circuitry, the first and second capacitors C1A and C2A in the first matching section 30A may be provided in a reversed arrangement from that in the example shown in FIG. 1, and ditto for the first and second capacitors C1B and C2B in the second matching section 30B. More specifically, in the first matching section 30A, the first capacitor C1A may be provided between the second end L1A2 of the first inductor L1A and the first end L2A1 of the second inductor L2A, and the second capacitor C2A may be provided between the first end L1A1 of the first inductor L1A and the first end L2A1 of the second inductor L2A. In this case, in the second matching section 30B, the first capacitor C1B is provided between the second end L1B2 of the first inductor L1B and the first end L2B1 of the second inductor L2B, and the second capacitor C2B is provided between the first end L1B1 of the first inductor L1B and the first end L2B1 of the second inductor L2B.

The operation and effects of the directional coupler 1 according to the first embodiment will now be described. The directional coupler 1 is usable in the following first and second modes of use. In the first mode of use, the first port 11 serves as the input port, the second port 12 serves as the output port, the third port 13 serves as the coupling port, and the fourth port 14 serves as the terminal port. In the first mode of use, the fourth port 14 is grounded via a terminator having a resistance of, for example, 50 Ω. In the second mode of use, the second port 12 serves as the input port, the first port 11 serves as the output port, the fourth port 14 serves as the coupling port, and the third port 13 serves as the terminal port. In the second mode of use, the third port 13 is grounded via a terminator having a resistance of, for example, 50 Ω.

In the first mode of use, a high frequency signal is received at the first port 11 and output from the second port 12. The third port 13 outputs a coupling signal having a power that depends on the power of the high frequency signal received at the first port 11.

In the first mode of use, a first, a second and a third signal path are formed between the first port 11 serving as the input port and the third port 13 serving as the coupling port. The first signal path passes through the first coupling section 40A. The second signal path passes through the second coupling section 40B and the first matching section 30A. The third signal path passes through the third coupling section 40C, the second matching section 30B and the first matching section 30A. When a high frequency signal has been received at the first port 11, the coupling signal to be output from the third port 13 is a signal resulting from a combination of a signal having passed through the first signal path, a signal having passed through the second signal path, and a signal having passed through the third signal path. The coupling of the directional coupler 1 used in the first mode of use depends on the strength of coupling of each of the first to third coupling sections 40A, 40B and 40C and the relationship among the phases of the signal having passed through the first signal path, the signal having passed through the second signal path, and the signal having passed through the third signal path.

In the first mode of use, a fourth, a fifth and a sixth signal path are formed between the second port 12 serving as the output port and the third port 13 serving as the coupling port. The fourth signal path passes through the first coupling section 40A. The fifth signal path passes through the second coupling section 40B and the first matching section 30A. The sixth signal path passes through the third coupling section 40C, the second matching section 30B and the first matching section 30A. The isolation of the directional coupler used in the first mode of use depends on the strength of coupling of each of the first to third coupling sections 40A, 40B and 40C and the relationship among the phases of the signal having passed through the fourth signal path, the signal having passed through the fifth signal path, and the signal having passed through the sixth signal path.

In the second mode of use, a high frequency signal is received at the second port 12 and output from the first port 11. The fourth port 14 outputs a coupling signal having a power that depends on the power of the high frequency signal received at the second port 12.

In the second mode of use, a seventh, an eighth and a ninth signal path are formed between the second port 12 serving as the input port and the fourth port 14 serving as the coupling port. The seventh signal path passes through the third coupling section 40C. The eighth signal path passes through the second coupling section 40B and the second matching section 30B. The ninth signal path passes through the first coupling section 40A, the first matching section 30A and the second matching section 30B. When a high frequency signal has been received at the second port 12, the coupling signal to be output from the fourth port 14 is a signal resulting from a combination of a signal having passed through the seventh signal path, a signal having passed through the eighth signal path, and a signal having passed through the ninth signal path. The coupling of the directional coupler 1 used in the second mode of use depends on the strength of coupling of each of the first, the second and the third coupling sections 40A, 40B and 40C and the relationship among the phases of the signal having passed through the seventh signal path, the signal having passed through the eighth signal path, and the signal having passed through the ninth signal path.

In the second mode of use, a tenth, an eleventh and a twelfth signal path are formed between the first port 11 serving as the output port and the fourth port 14 serving as the coupling port. The tenth signal path passes through the third coupling section 40C. The eleventh signal path passes through the second coupling section 40B and the second matching section 30B. The twelfth signal path passes through the first coupling section 40A, the first matching section 30A and the second matching section 30B. The isolation of the directional coupler used in the second mode of use depends on the strength of coupling of each of the first to third coupling sections 40A, 40B and 40C and the relationship among the phases of the signal having passed through the tenth signal path, the signal having passed through the eleventh signal path, and the signal having passed through the twelfth signal path.

Figure 2:
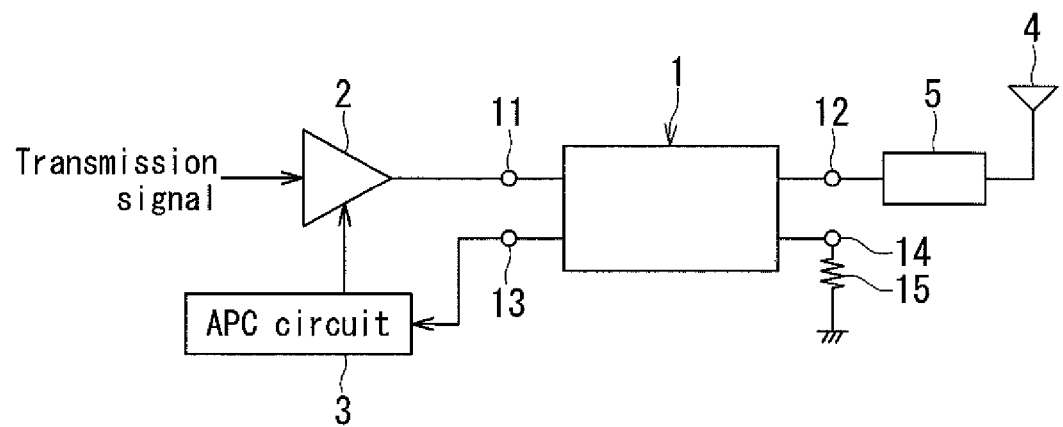
FIG. 2 is a circuit diagram illustrating an example of use of the directional coupler according to the first embodiment of the invention.

Now, an example of use of the directional coupler 1 in the first and second modes of use will be described with reference to FIG. 2. FIG. 2 is a circuit diagram illustrating an example of use of the directional coupler 1. FIG. 2 illustrates a transmission circuit including the directional coupler 1. The transmission circuit shown in FIG. 2 includes a power amplifier 2, an automatic power control (APC) circuit 3 and an impedance matching element 5, in addition to the directional coupler 1.

The power amplifier 2 has an input, an output, and a gain control end. The input of the power amplifier 2 receives a transmission signal, which is a high frequency signal. The output of the power amplifier 2 is connected to the first port 11 of the directional coupler 1.

The APC circuit 3 has an input and an output. The input of the APC circuit 3 is connected to the third port 13 of the directional coupler 1. The output of the APC circuit 3 is connected to the gain control end of the power amplifier 2.

The second port 12 of the directional coupler 1 is connected to an antenna 4 via the impedance matching element 5. The impedance matching element 5 is an element for performing impedance matching between the transmission circuit and the antenna 4 in order to sufficiently reduce the level of a reflected wave signal resulting from the transmission signal reflected at the antenna 4. The fourth port 14 of the directional coupler 1 is grounded via the terminator 15.

Next, the first mode of use of the directional coupler 1 in the transmission circuit shown in FIG. 2 will be described. In the first mode of use, the transmission signal amplified by the power amplifier 2 is received at the first port 11 and output from the second port 12. The third port 13 outputs a coupling signal having a power that depends on the level of the transmission signal received at the first port 11. The transmission signal output from the second port 12 goes through the impedance matching element 5 and is emitted from the antenna 4. The coupling signal output from the third port 13 is received at the APC circuit 3. In accordance with the level of the coupling signal output from the third port 13, the APC circuit 3 controls the gain of the power amplifier 2 so that the power amplifier 2 provides an output signal of approximately constant level.

Next, the second mode of use of the directional coupler 1 in the transmission circuit shown in FIG. 2 will be described. In the second mode of use, the directional coupler 1 is used to detect the level of a reflection wave signal resulting from the transmission signal reflected at the antenna 4. In the second mode of use, the reflected wave signal is the high frequency signal to be received at the directional coupler 1. The reflected wave signal is received at the second port 12 and output from the first port 11. Thus, in the second mode of use, the second port 12 serves as the input port, the first port 11 serves as the output port, the fourth port 14 serves as the coupling port, and the third port 13 serves as the terminal port. In the second mode of use, the third port 13 is grounded via a terminator. The fourth port 14 is connected with a power detector (not illustrated). The fourth port 14 outputs a coupling signal having a power that depends on the power of the reflected wave signal received at the second port 12. The non-illustrated power detector detects the level of the coupling signal. The information on the level of the coupling signal is used to adjust the characteristics of the impedance matching element 5 so as to sufficiently reduce the level of the reflected wave signal.

The level of the reflected wave signal received at the directional coupler 1 is lower than that of the transmission signal received at the directional coupler 1. Thus, sufficient isolation is required of the directional coupler 1 not only in the first mode of use but also in the second mode of use.

The directional coupler 1 according to the first embodiment has circuitry that is symmetric with respect to the second coupling section 40B, as mentioned previously. The directional coupler 1 is thus bidirectional. Consequently, the directional coupler 1 is usable in the first and second modes of use, and provides the same characteristics regardless of whether used in the first mode of use or the second mode of use.

Regardless of whether used in the first mode of use or the second mode of use, the directional coupler 1 according to the first embodiment is able to reduce a change in the coupling of the directional coupler 1 in response to a change in the frequency of a signal received at the directional coupler 1. This will be described in detail below.

The strength of coupling of each of the first to third coupling sections 40A, 40B and 40C increases with increasing frequency of the signal received at the directional coupler 1. In this case, given a fixed amount of change in the phase of a signal when passing through each of the first and second matching sections 30A and 30B, a change in the frequency of the signal received at the directional coupler 1 causes a change in the power of the coupling signal.

On the other hand, the amount of change in the phase of a signal when passing through each of the first and second matching sections 30A and 30B varies depending on the frequency of the signal received at the directional coupler 1, that is, the frequency of the signal passing through each of the first and second matching sections 30A and 30B. In this case, given a fixed strength of coupling of each of the first to third coupling sections 40A, 40B and 40C, a change in the frequency of the signal received at the directional coupler 1 causes a change in the power of the coupling signal.

The first and second matching sections 30A and 30B are designed so that in the service frequency band of the directional coupler 1, a change in the power of the coupling signal is smaller than that in the case with a fixed amount of change in the phase of a signal when passing through each of the first and second matching sections 30A and 30B. This allows the directional coupler 1 to be capable of reducing a change in the coupling of the directional coupler 1 in response to a change in the frequency of the signal received at the directional coupler 1 in both of the first and second modes of use.

Figure 3:
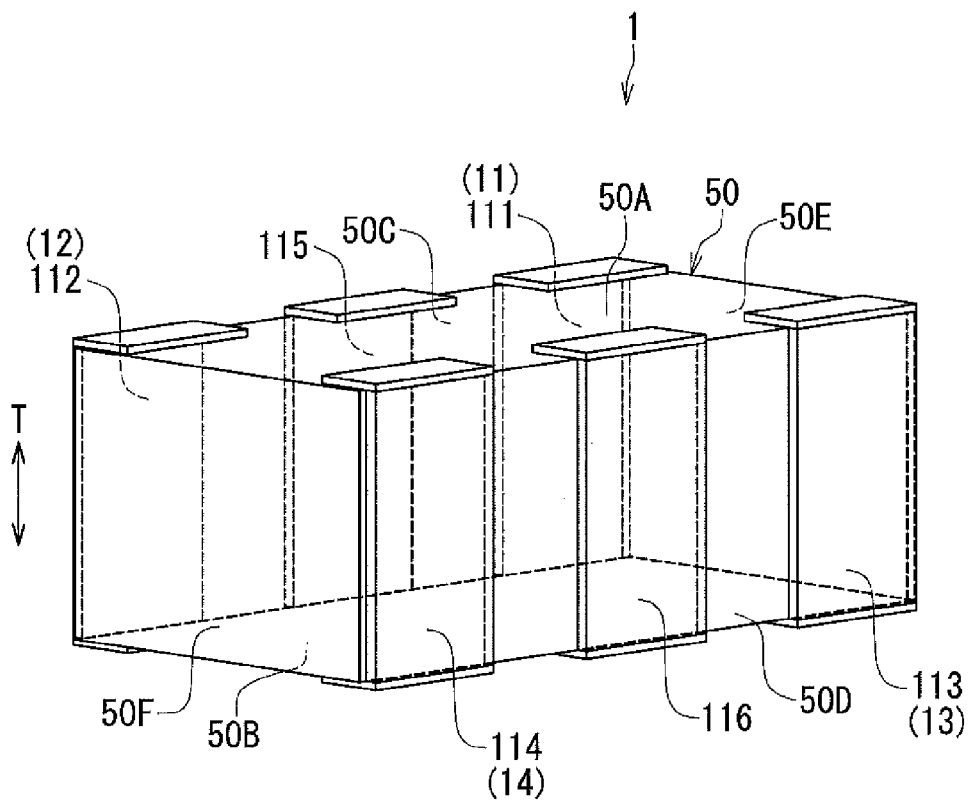
FIG. 3 is a perspective view of the directional coupler according to the first embodiment of the invention.

An example of the structure of the directional coupler 1 will now be described. FIG. 3 is a perspective view of the directional coupler 1. The directional coupler 1 shown in FIG. 3 includes a stack 50 for integrating the first to fourth ports 11 to 14, the main line 10, the first to third subline sections 20A, 20B and 20C, and the first and second matching sections 30A and 30B. As will be described in detail later, the stack 50 includes a plurality of dielectric layers and and a plurality of conductor layers stacked on each other. Each of the inductors L1A, L2A, L1B and L2B is formed using one or more conductor layers among the plurality of conductor layers of the stack 50. Each of the capacitors C1A, C2A, C1B and C2B is formed using two or more conductor layers among the plurality of conductor layers of the stack 50.

The stack 50 is shaped like a rectangular solid and has a periphery. The periphery of the stack 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. For the stack 50, a direction perpendicular to the top surface 50A and the bottom surface 50B is the stacking direction of the plurality of dielectric layers and conductor layers. The stacking direction is shown by the arrow T in FIG. 3.

The directional coupler 1 shown in FIG. 3 has a first terminal 111, a second terminal 112, a third terminal 113, a fourth terminal 114, and two ground terminals 115 and 116. The first to fourth terminals 111, 112, 113 and 114 correspond to the first to fourth ports 11, 12, 13 and 14 shown in FIG. 1, respectively. The ground terminals 115 and 116 are connected to the ground. The terminals 111 to 116 are provided on the periphery of the stack 50. The terminals 111, 112 and 115 are arranged to extend from the top surface 50A to the bottom surface 50B through the side surface 50C. The terminals 113, 114 and 116 are arranged to extend from the top surface 50A to the bottom surface 50B through the side surface 50D.

Figure 4:
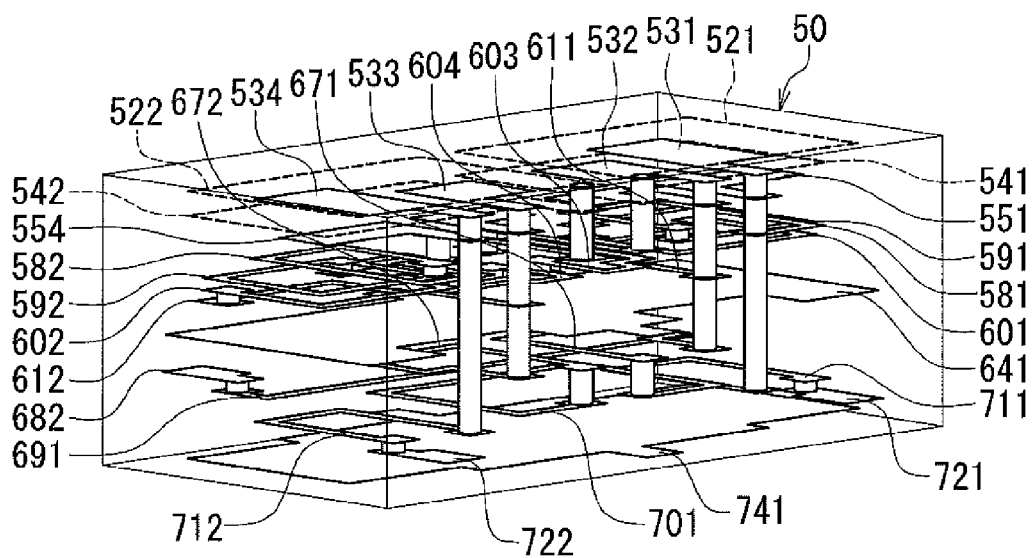
FIG. 4 is a perspective internal view of a stack included in the directional coupler shown in FIG. 3.
Figure 5:
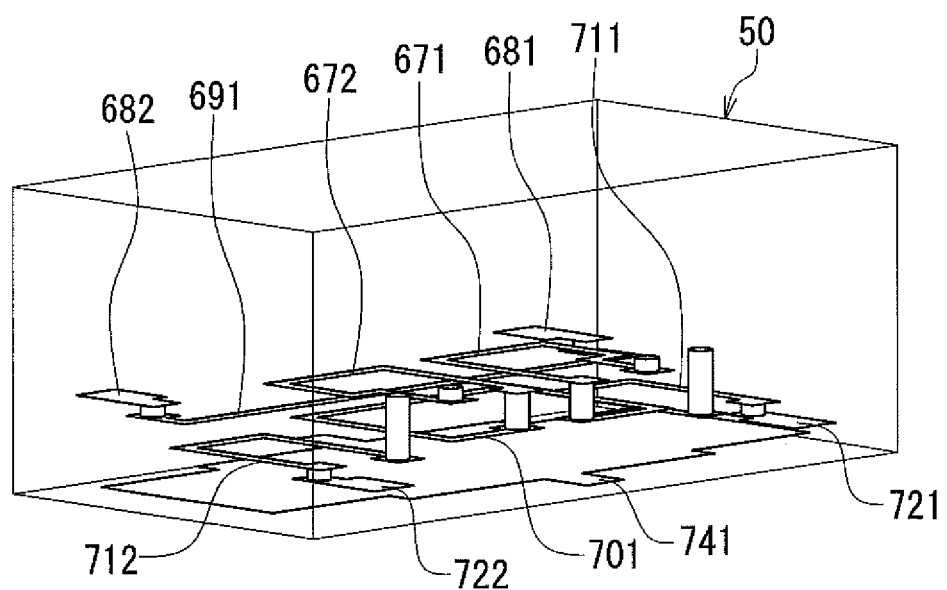
FIG. 5 is a perspective, partial internal view of the stack included in the directional coupler shown in FIG. 3.

The stack 50 will now be described in detail with reference to FIG. 4 to FIG. 11D. The stack 50 includes twenty-four dielectric layers stacked on top of one another. The twenty-four dielectric layers will be referred to as the first to twenty-fourth dielectric layers in the order from top to bottom. FIG. 4 is a perspective internal view of the stack 50. FIG. 5 is a perspective, partial internal view of the stack 50. FIG. 6A to FIG. 6D illustrate the top surfaces of the first to fourth dielectric layers, respectively. FIG. 7A to FIG. 7D illustrate the top surfaces of the fifth to eighth dielectric layers, respectively, FIG. 8A to FIG. 8D illustrate the top surfaces of the ninth to twelfth dielectric layers, respectively. FIG. 9A to FIG. 9D illustrate the top surfaces of the thirteenth to sixteenth dielectric layers, respectively. FIG. 10A to FIG. 10D illustrate the top surfaces of the seventeenth to twentieth dielectric layers, respectively. FIG. 11A to FIG. 11D illustrate the top surfaces of the twenty-first to twenty-fourth dielectric layers, respectively.

Figure 6A:
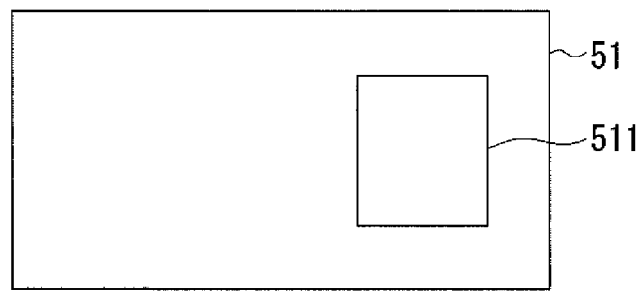
FIG. 6A to FIG. 6D are explanatory diagrams illustrating the respective top surfaces of the first to fourth dielectric layers of the stack included in the directional coupler shown in FIG. 3.
Figure 6B:
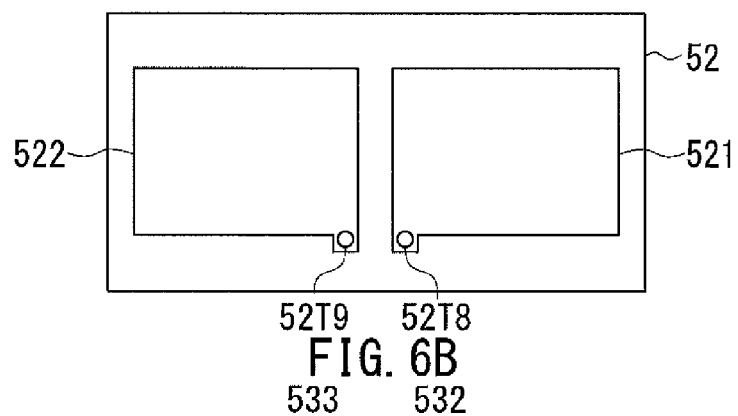

As shown in FIG. 6A, a conductor layer 511 is formed on the top surface of the first dielectric layer 51. The conductor layer 511 is used as a mark. As shown in FIG. 6B, conductor layers 521 and 522 are formed on the top surface of the second dielectric layer 52. The conductor layer 521 is used for forming the capacitors C1A and C2A. The conductor layer 522 is used for forming the capacitors C1B and C2B. Further, through holes 52T8 and 52T9 are formed in the dielectric layer 52. The through hole 52T8 is connected to the conductor layer 521. The through hole 52T9 is connected to the conductor layer 522.

Figure 6C:
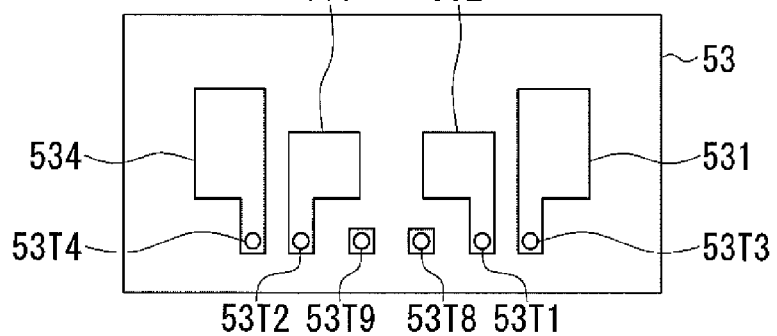

As shown in FIG. 6C, conductor layers 531, 532, 533 and 534 are formed on the top surface of the third dielectric layer 53. The conductor layers 531, 532, 533 and 534 are used for forming the capacitors C1A, C2A, C2B and C1B, respectively. Further, through holes 53T1, 53T2, 53T3, 53T4, 53T8 and 53T9 are formed in the dielectric layer 53. The through hole 53T1 is connected to the conductor layer 532. The through hole 53T2 is connected to the conductor layer 533. The through hole 53T3 is connected to the conductor layer 531. The through hole 53T4 is connected to the conductor layer 534. The through holes 52T8 and 52T9 shown in FIG. 6B are connected to the through holes 53T8 and 53T9, respectively.

Figure 6D:
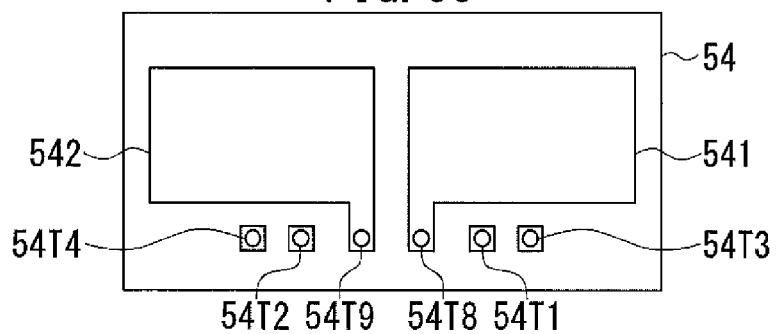

As shown in FIG. 6D, conductor layers 541 and 542 are formed on the top surface of the fourth dielectric layer 54. The conductor layer 541 is used for forming the capacitors CIA and C2A. The conductor layer 542 is used for forming the capacitors C1B and C2B. Further, through holes 54T1, 54T2, 54T3, 54T4, 54T8 and 54T9 are formed in the dielectric layer 54. The through holes 53T1, 53T2, 53T3 and 53T4 shown in FIG. 6C are connected to the through holes 54T1, 54T2, 54T3 and 54T4, respectively. The through hole 54T8 is connected to the conductor layer 541 and to the through hole 53T8 shown in FIG. 6C. The through hole 54T9 is connected to the conductor layer 542 and to the through hole 53T9 shown in FIG. 6C.

Figure 7A:
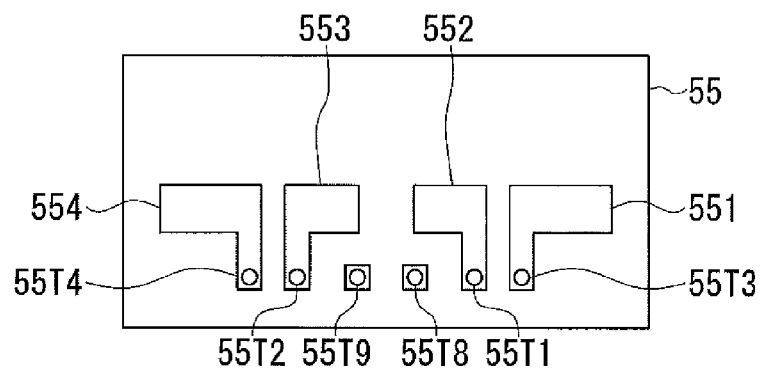
FIG. 7A to FIG. 7D are explanatory diagrams illustrating the respective top surfaces of the fifth to eighth dielectric layers of the stack included in the directional coupler shown in FIG. 3.

As shown in FIG. 7A, conductor layers 551, 552, 553 and 554 are formed on the top surface of the fifth dielectric layer 55. The conductor layers 551, 552, 553 and 554 are used for forming the capacitors C1A, C2A, C2B and C1B, respectively. Further, through holes 55T1, 55T2, 55T3, 55T4, 55T8 and 55T9 are formed in the dielectric layer 55. The through hole 55T1 is connected to the conductor layer 552 and to the through hole 54T1 shown in FIG. 6D. The through hole 55T2 is connected to the conductor layer 553 and to the through hole 54T2 shown in FIG. 6D. The through hole 55T3 is connected to the conductor layer 551 and to the through hole 54T3 shown in FIG. 6D. The through hole 55T4 is connected to the conductor layer 554 and to the through hole 54T4 shown in FIG. 6D. The through holes 54T8 and 54T9 shown in FIG. 6D are connected to the through holes 55T8 and 55T9, respectively.

Figure 7B:
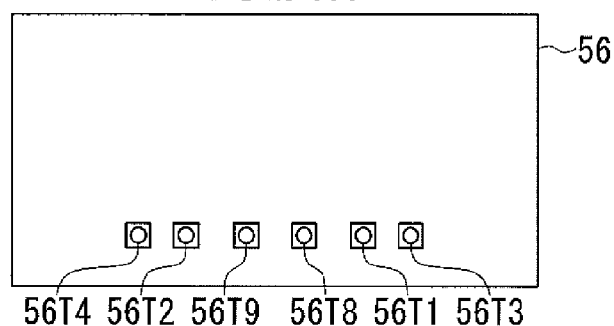

As shown in FIG. 7B, through holes 56T1, 56T2, 56T3, 56T4, 56T8 and 56T9 are formed in the sixth dielectric layer 56. The through holes 55T1, 55T2, 55T3, 55T4, 55T8 and 55T9 shown in FIG. 7A are connected to the through holes 56T1, 56T2, 56T3, 56T4, 56T8 and 56T9, respectively.

Figure 7C:
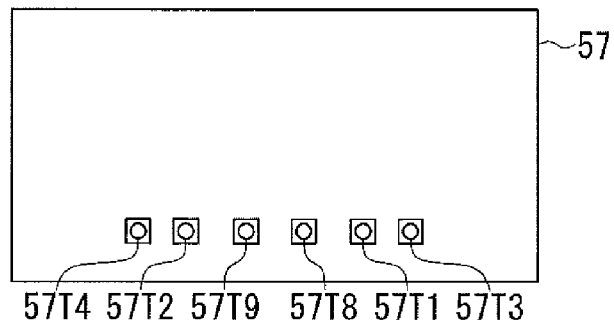

As shown in FIG. 7C, through holes 57T1, 57T2, 57T3, 57T4, 57T8 and 57T9 are formed in the seventh dielectric layer 57. The through holes 56T1, 56T2, 56T3, 56T4, 56T8 and 56T9 shown in FIG. 7B are connected to the through holes 57T1, 57T2, 57T3, 57T4, 57T8 and 57T9, respectively.

Figure 7D:
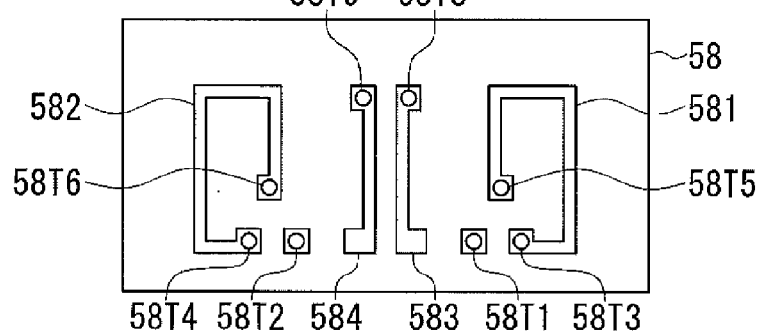

As shown in FIG. 7D, conductor layers 581, 582, 583 and 584 are formed on the top surface of the eighth dielectric layer 58. The conductor layers 581 and 582 are used for forming the inductors L1A and L1B, respectively. Each of the conductor layers 581, 582, 583 and 584 has a first end and a second end. Further, through holes 58T1, 58T2, 58T3, 58T4, 58T5, 58T6, 58T8 and 58T9 are formed in the dielectric layer 58. The through holes 57T1 and 57T2 shown in FIG. 7C are connected to the through holes 58T1 and 58T2, respectively. The through hole 58T3 is connected to a portion of the conductor layer 581 near the first end thereof and to the through hole 57T3 shown in FIG. 7C. The through hole 58T4 is connected to a portion of the conductor layer 582 near the first end thereof and to the through hole 57T4 shown in FIG. 7C. The through hole 58T5 is connected to a portion of the conductor layer 581 near the second end thereof. The through hole 58T6 is connected to a portion of the conductor layer 582 near the second end thereof. The through hole 58T8 is connected to a portion of the conductor layer 583 near the first end thereof. The through hole 58T9 is connected to a portion of the conductor layer 584 near the first end thereof. The through hole 57T8 shown in FIG. 7C is connected to a portion of the conductor layer 583 near the second end thereof. The through hole 57T9 shown in FIG. 7C is connected to a portion of the conductor layer 584 near the second end thereof.

Figure 8A:
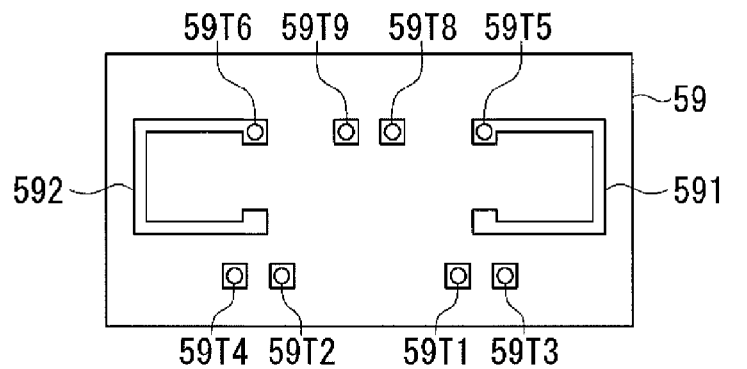
FIG. 8A to FIG. 8D are explanatory diagrams illustrating the respective top surfaces of the ninth to twelfth dielectric layers of the stack included in the directional coupler shown in FIG. 3.

As shown in FIG. 8A, conductor layers 591 and 592 are formed on the top surface of the ninth dielectric layer 59. The conductor layers 591 and 592 are used for forming the inductors L1A and L1B, respectively. Each of the conductor layers 591 and 592 has a first end and a second end. Further, through holes 59T1, 59T2, 59T3, 59T4, 59T5, 59T6, 59T8 and 59T9 are formed in the dielectric layer 59. The through holes 58T1, 58T2, 58T3, 58T4, 58T8 and 58T9 shown in FIG. 7D are connected to the through holes 59T1, 59T2, 59T3, 59T4, 59T8 and 59T9, respectively. The through hole 59T5 is connected to a portion of the conductor layer 591 near the first end thereof. The through hole 59T6 is connected to a portion of the conductor layer 592 near the first end thereof. The through hole 58T5 shown in FIG. 7D is connected to a portion of the conductor layer 591 near the second end thereof. The through hole 58T6 shown in FIG. 7D is connected to a portion of the conductor layer 592 near the second end thereof.

As shown in FIG. 813, conductor layers 601, 602, 603 and 604 are formed on the top surface of the tenth dielectric layer 60. The conductor layers 601, 602, 603 and 604 are used for forming the inductors L1A, L1B, L2A and L2B, respectively. Each of the conductor layers 601, 602, 603 and 604 has a first end and a second end. Further, through holes 60T1, 60T2, 60T3, 60T4, 60T5, 60T6, 60T8 and 60T9 are formed in the dielectric layer 60. The through holes 59T1, 59T2, 59T3 and 59T4 shown in FIG. 8A are connected to the through holes 60T1, 60T2, 60T3 and 60T4, respectively. The through hole 60T5 is connected to a portion of the conductor layer 601 near the first end thereof The through hole 60T6 is connected to a portion of the conductor layer 602 near the first end thereof. The through hole 60T8 is connected to a portion of the conductor layer 603 near the first end thereof. The through hole 60T9 is connected to a portion of the conductor layer 604 near the first end thereof The through hole 59T5 shown in FIG. 8A is connected to a portion of the conductor layer 601 near the second end thereof. The through hole 59T6 shown in FIG. 8A is connected to a portion of the conductor layer 602 near the second end thereof. The through hole 59T8 shown in FIG. 8A is connected to a portion of the conductor layer 603 near the second end thereof. The through hole 59T9 shown in FIG. 8A is connected to a portion of the conductor layer 604 near the second end thereof.

Figure 8B:
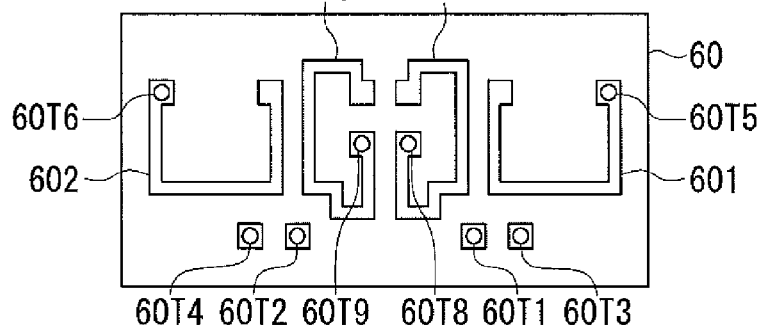
Figure 8C:
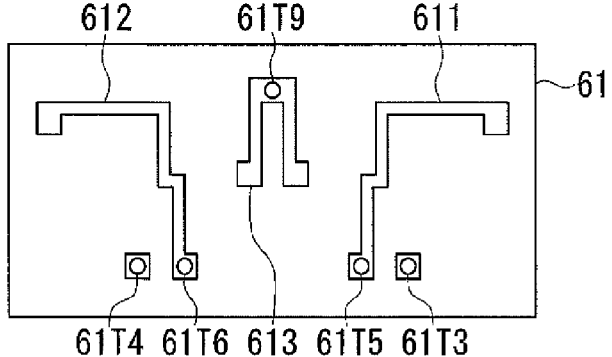

As shown in FIG. 8C, conductor layers 611, 612 and 613 are formed on the top surface of the eleventh dielectric layer 61. Each of the conductor layers 611, 612 and 613 has a first end and a second end. Further, through holes 61T3, 61T4, 61T5, 61T6 and 61T9 are formed in the dielectric layer 61. The through holes 60T3 and 60T4 shown in FIG. 8B are connected to the through holes 61T3 and 61T4, respectively. The through hole 61T5 is connected to a portion of the conductor layer 611 near the first end thereof and to the through hole 60T1 shown in FIG. 8B. The through hole 61T6 is connected to a portion of the conductor layer 612 near the first end thereof and to the through hole 60T2 shown in FIG. 8B. The through hole 61T9 is connected to a portion of the conductor layer 613 between the first and second ends thereof. The through hole 60T5 shown in FIG. 8B is connected to a portion of the conductor layer 611 near the second end thereof. The through hole 60T6 shown in FIG. 8B is connected to a portion of the conductor layer 612 near the second end thereof. The through hole 60T8 shown in FIG. 8B is connected to a portion of the conductor layer 613 near the first end thereof. The through hole 60T9 shown in FIG. 8B is connected to a portion of the conductor layer 613 near the second end thereof.

Figure 8D:
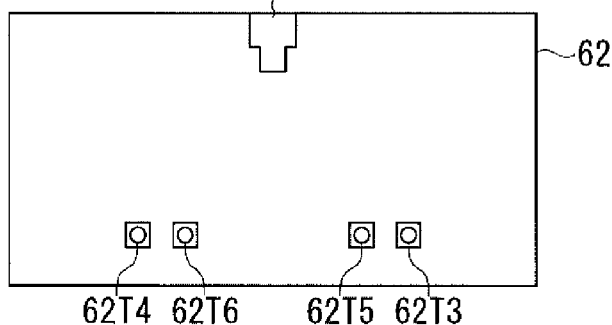

As shown in FIG. 8D, a conductor layer 621 is formed on the top surface of the twelfth dielectric layer 62. The conductor layer 621 is connected to the ground terminal 115 shown in FIG. 3. Further, through holes 62T3, 62T4, 62T5 and 62T6 are formed in the dielectric layer 62. The through holes 61T3, 61T4, 61T5 and 61T6 shown in FIG. 8C are connected to the through holes 62T3, 62T4, 62T5 and 62T6, respectively. The through hole 61T9 shown in FIG. 8C is connected to the conductor layer 621.

Figure 9A:
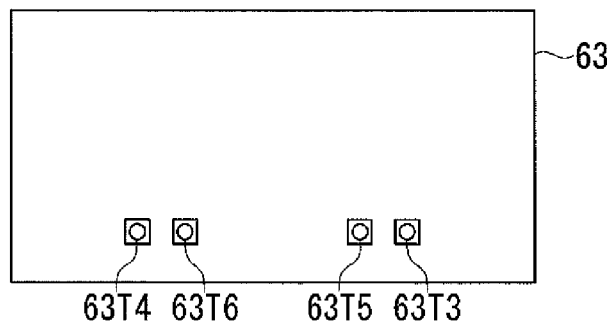
FIG. 9A to FIG. 9D are explanatory diagrams illustrating the respective top surfaces of the thirteenth to sixteenth dielectric layers of the stack included in the directional coupler shown in FIG. 3.

As shown in FIG. 9A, through holes 63T3, 63T4, 63T5 and 63T6 are formed in the thirteenth dielectric layer 63. The through holes 62T3, 62T4, 62T5 and 62T6 shown in FIG. 8D are connected to the through holes 63T3, 63T4, 63T5 and 63T6, respectively.

Figure 9B:
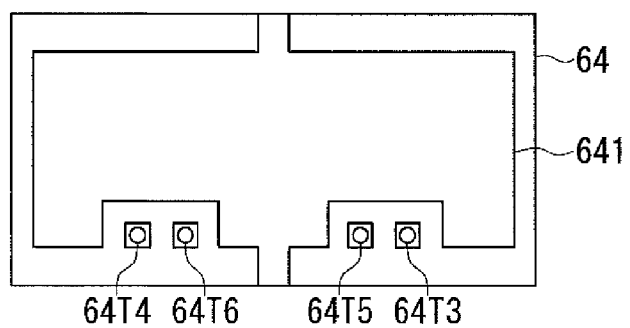

As shown in FIG. 9B, a ground conductor layer 641 is formed on the top surface of the fourteenth dielectric layer 64. The ground conductor layer 641 is connected to the ground terminals 115 and 116 shown in FIG. 3. Further, through holes 64T3, 64T4, 64T5 and 64T6 are formed in the dielectric layer 64. The through holes 63T3, 63T4, 63T5 and 63T6 shown in FIG. 9A are connected to the through holes 64T3, 64T4, 64T5 and 64T6, respectively.

Figure 9C:
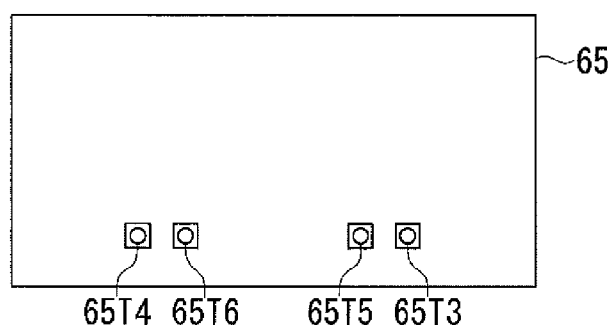

As shown in FIG. 9C, through holes 65T3, 65T4, 65T5 and 65T6 are formed in the fifteenth dielectric layer 65. The through holes 64T3, 64T4, 64T5 and 64T6 shown in FIG. 9B are connected to the through holes 65T3, 65T4, 65T5 and 65T6, respectively.

Figure 9D:
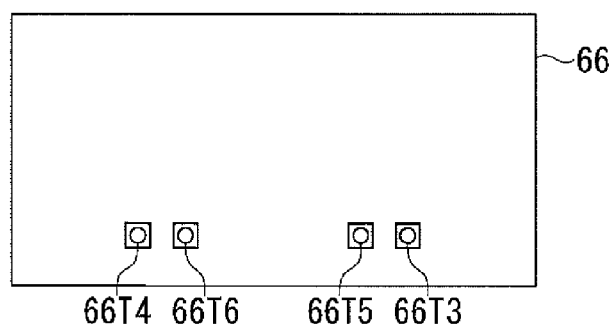

As shown in FIG. 9D, through holes 66T3, 66T4, 66T5 and 66T6 are formed in the sixteenth dielectric layer 66. The through holes 65T3, 65T4, 65T5 and 65T6 shown in FIG. 9C are connected to the through holes 66T3, 66T4, 66T5 and 66T6, respectively.

Figure 10A:
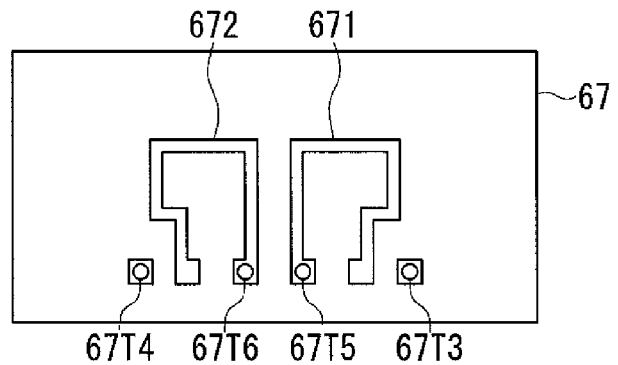
FIG. 10A to FIG. 10D are explanatory diagrams illustrating the respective top surfaces of the seventeenth to twentieth dielectric layers of the stack included in the directional coupler shown in FIG. 3.

As shown in FIG. 10A, conductor layers 671 and 672 are formed on the top surface of the seventeenth dielectric layer 67. The conductor layers 671 and 672 are used for forming the second subline section 20B. Each of the conductor layers 671 and 672 has a first end and a second end. Further, through holes 67T3, 67T4, 67T5 and 67T6 are formed in the dielectric layer 67. The through holes 66T3 and 66T4 shown in FIG. 9D are connected to the through holes 67T3 and 67T4, respectively. The through hole 67T5 is connected to a portion of the conductor layer 671 near the first end thereof. The through hole 67T6 is connected to a portion of the conductor layer 672 near the first end thereof The through hole 66T5 shown in FIG. 9D is connected to a portion of the conductor layer 671 near the second end thereof The through hole 66T6 shown in FIG. 9D is connected to a portion of the conductor layer 672 near the second end thereof.

Figure 10B:
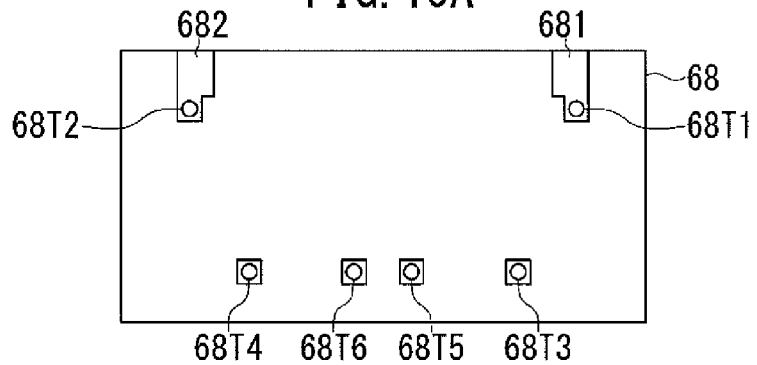

As shown in FIG. 10B, conductor layers 681 and 682 are formed on the top surface of the eighteenth dielectric layer 68. The conductor layer 681 is connected to the first terminal 111 shown in FIG. 3. The conductor layer 682 is connected to the second terminal 112 shown in FIG. 3. Further, through holes 68T1, 68T2, 68T3, 68T4, 68T5 and 68T6 are formed in the dielectric layer 68. The through hole 68T1 is connected to the conductor layer 681. The through hole 68T2 is connected to the conductor layer 682. The through holes 67T3, 67T4, 67T5 and 67T6 shown in FIG. 10A are connected to the through holes 68T3, 68T4, 68T5 and 68T6, respectively.

Figure 10C:
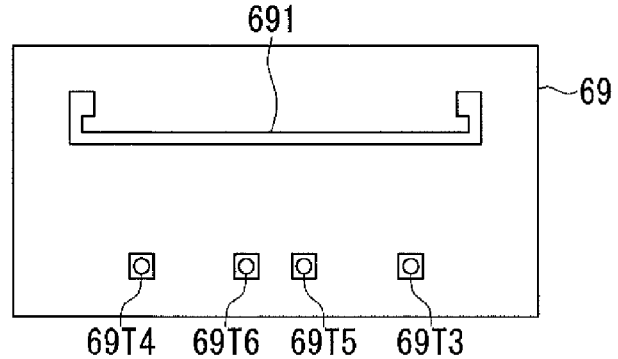

As shown in FIG. 10C, a conductor layer 691 is formed on the top surface of the nineteenth dielectric layer 69. The conductor layer 691 is used for forming the main line 10, and has a first end and a second end. Further, through holes 69T3, 69T4, 69T5 and 69T6 are formed in the dielectric layer 69. The through holes 68T3, 68T4, 68T5 and 68T6 shown in FIG. 10B are connected to the through holes 69T3, 69T4, 69T5 and 69T6, respectively. The through hole 68T1 shown in FIG. 10B is connected to a portion of the conductor layer 691 near the first end thereof. The through hole 68T2 shown in FIG. 10B is connected to a portion of the conductor layer 691 near the second end thereof.

Figure 10D:
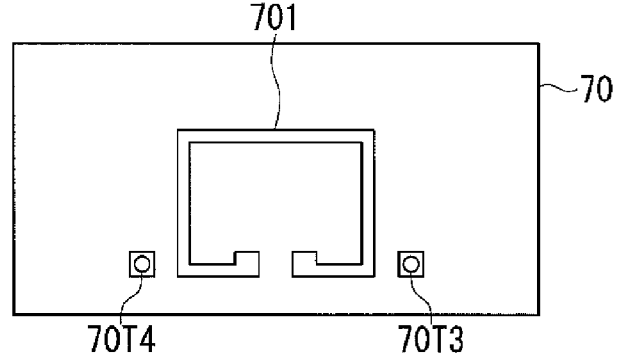

As shown in FIG. 10D, a conductor layer 701 is formed on the top surface of the twentieth dielectric layer 70. The conductor layer 701 is used for forming the second subline section 20B, and has a first end and a second end. Further, through holes 70T3 and 70T4 are formed in the dielectric layer 70. The through holes 69T3 and 69T4 shown in FIG. 10C are connected to the through holes 70T3 and 70T4, respectively. The through hole 69T5 shown in FIG. 10C is connected to a portion of the conductor layer 701 near the first end thereof. The through hole 69T6 shown in FIG. 10C is connected to a portion of the conductor layer 701 near the second end thereof.

Figure 11A:
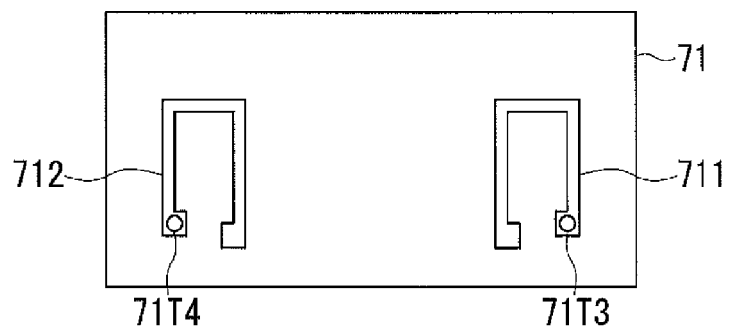
FIG. 11A to FIG. 11D are explanatory diagrams illustrating the respective top surfaces of the twenty-first to twenty-fourth dielectric layers of the stack included in the directional coupler shown in FIG. 3.

As shown in FIG. 11A, conductor layers 711 and 712 are formed on the top surface of the twenty-first dielectric layer 71. The conductor layers 711 and 712 are used for forming the first and third subline sections 20A and 20C, respectively. Each of the conductor layers 711 and 712 has a first end and a second end. Further, through holes 71T3 and 71T4 are formed in the dielectric layer 71. The through hole 71T3 is connected to a portion of the conductor layer 711 near the first end thereof. The through hole 71T4 is connected to a portion of the conductor layer 712 near the first end thereof. The through hole 70T3 shown in FIG. 10D is connected to a portion of the conductor layer 711 near the second end thereof. The through hole 70T4 shown in FIG. 10D is connected to a portion of the conductor layer 712 near the second end thereof.

Figure 11B:
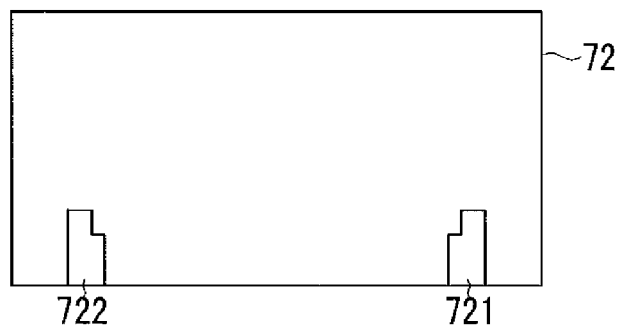

As shown in FIG. 11B, conductor layers 721 and 722 are formed on the top surface of the twenty-second dielectric layer 72. The conductor layer 721 is connected to the third terminal 113 shown in FIG. 3. The conductor layer 722 is connected to the fourth terminal 114 shown in FIG. 3. The through hole 71T3 shown in FIG. 11A is connected to the conductor layer 721. The through hole 71T4 shown in FIG. 11A is connected to the conductor layer 722.

Figure 11C:
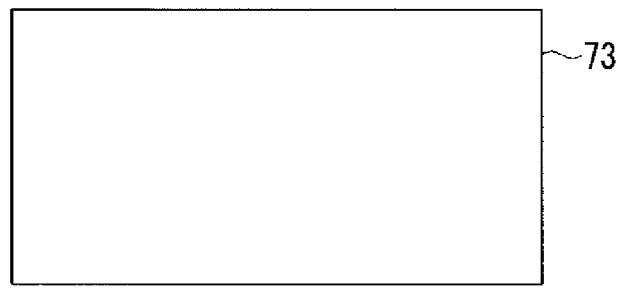
Figure 11D:
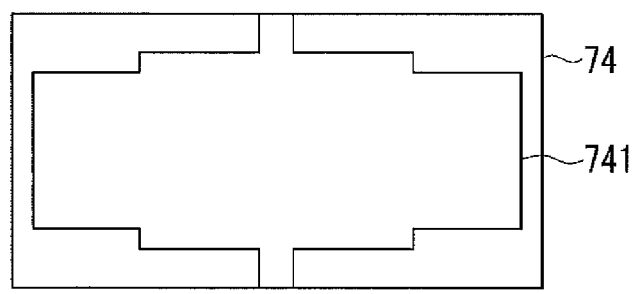

As shown in FIG. 11C, no conductor layer is formed on the top surface of the twenty-third dielectric layer 73. As shown in FIG. 11D, a ground conductor layer 741 is formed on the top surface of the twenty-fourth dielectric layer 74. The ground conductor layer 741 is connected to the ground terminals 115 and 116 shown in FIG. 3.

The stack 50 shown in FIG. 3 is formed by stacking the first to twenty-fourth dielectric layers 51 to 74. Then, the terminals 111 to 116 are formed on the periphery of the stack 50 to complete the directional coupler 1 shown in FIG. 3. FIG. 3 omits the illustration of the conductor layer 511.

FIG. 4 shows the interior of the stack 50. In FIG. 4, the conductor layers 521, 522, 541 and 542 are shown by broken lines. FIG. 5 shows part of the interior of the stack 50. FIG. 5 omits the illustration of some of the conductor layers that are located on or above the conductor layers 671 and 672.

Correspondences of the circuit components of the directional coupler 1 shown in FIG. 1 with the components inside the stack 50 shown in FIG. 6A to FIG. 11D will now be described. The main line 10 is formed by the conductor layer 691 shown in FIG. 10C. The conductor layer 691 includes a first portion forming the first portion 10A of the main line 10, a second portion forming the second portion 10B of the main line 10, and a third portion forming the third portion 10C of the main line 10.

Part of the conductor layer 711 shown in FIG. 11A is opposed to the bottom surface of the first portion of the conductor layer 691 with the dielectric layers 69 and 70 interposed therebetween. The aforementioned part of the conductor layer 711 constitutes the first subline section 20A.

The second subline section 20B is formed as follows. The portion of the conductor layer 671 (FIG. 10A) near the first end thereof is connected to the portion of the conductor layer 701 (FIG. 10D) near the first end thereof via the through holes 67T5, 68T5 and 69T5. The portion of the conductor layer 672 (FIG. 10A) near the first end thereof is connected to the portion of the conductor layer 701 near the second end thereof via the through holes 67T6, 68T6 and 69T6. Part of the conductor layer 671 is opposed to part of the top surface of the second portion of the conductor layer 691 with the dielectric layers 67 and 68 interposed therebetween. Part of the conductor layer 672 is opposed to another part of the top surface of the second portion of the conductor layer 691 with the dielectric layers 67 and 68 interposed therebetween. Part of the conductor layer 701 is opposed to part of the bottom surface of the second portion of the conductor layer 691 with the dielectric layer 69 interposed therebetween. The aforementioned parts of the conductor layers 671, 672 and 701 constitute the second subline section 20B.

Part of the conductor layer 712 shown in FIG. 11A is opposed to the bottom surface of the third portion of the conductor layer 691 with the dielectric layers 69 and 70 interposed therebetween. The aforementioned part of the conductor layer 712 constitutes the third subline section 20C.

The inductor L1A of the first matching section 30A is formed as follows. The conductor layers 581, 591 and 601 shown in FIGS. 7D, 8A and 8B are connected to each other in series via the through holes 58T5 and 59T5. The inductor L1A is constituted by these conductor layers 581, 591 and 601 and the two through holes 58T5 and 59T5 connecting them. The conductor layer 581 is connected to the conductor layer 711 constituting the first subline section 20A via the through holes 58T3, 59T3, 60T3, 61T3, 62T3, 63T3, 64T3, 65T3, 66T3, 67T3, 68T3, 69T3 and 70T3. The conductor layer 601 is connected to the conductor layer 671 constituting the second subline section 20B via the through hole 60T5, the conductor layer 611, and the through holes 61T5, 62T5, 63T5, 64T5, 65T5 and 66T5.

The capacitor C1A of the first matching section 30A is constituted by the conductor layers 521, 531, 541 and 551 shown in FIGS. 6B, 6C, 6D and 7A, the dielectric layer 52 interposed between the conductor layers 521 and 531, the dielectric layer 53 interposed between the conductor layers 531 and 541, and the dielectric layer 54 interposed between the conductor layers 541 and 551. The conductor layers 531 and 551 are connected to the conductor layer 711 constituting the first subline section 20A via the through holes 53T3, 54T3, 55T3, 56T3, 57T3, 58T3, 59T3, 60T3, 61T3, 62T3, 63T3, 64T3, 65T3, 66T3, 67T3, 68T3, 69T3 and 70T3.

The capacitor C2A of the first matching section 30A is constituted by the conductor layers 521, 532, 541 and 552 shown in FIGS. 6B, 6C, 6D and 7A, the dielectric layer 52 interposed between the conductor layers 521 and 532, the dielectric layer 53 interposed between the conductor layers 532 and 541, and the dielectric layer 54 interposed between the conductor layers 541 and 552. The conductor layers 532 and 552 are connected to the conductor layer 671 constituting the second subline section 20B via the through holes 53T1, 54T1, 55T1, 56T1, 57T1, 58T1, 59T1, 60T1, 61T5, 62T5, 63T5, 64T5, 65T5 and 66T5.

The inductor L2A of the first matching section 30A is constituted by the conductor layer 603 shown in FIG. 8B. The portion of the conductor layer 603 near the first end thereof is connected to the conductor layers 521 and 541 shown in FIGS. 6B and 6D via the through holes 59T8 and 58T8, the conductor layer 583, and the through holes 57T8, 56T8, 55T8, 54T8, 53T8 and 52T8. The portion of the conductor layer 603 near the second end thereof is connected to the conductor layer 621 shown in FIG. 8D via the through hole 60T8, the conductor layer 613, and the through hole 61T9.

The inductor L1B of the second matching section 30B is formed as follows. The conductor layers 582, 592 and 602 shown in FIGS. 7D, 8A and 8B are connected to each other in series via the through holes 58T6 and 59T6. The inductor L1B is constituted by these conductor layers 582, 592 and 602 and the two through holes 58T6 and 59T6 connecting them. The conductor layer 582 is connected to the conductor layer 712 constituting the third subline section 20C via the through holes 58T4, 59T4, 60T4, 61T4, 62T4, 63T4, 64T4, 65T4, 66T4, 67T4, 68T4, 69T4 and 70T4. The conductor layer 602 is connected to the conductor layer 672 constituting the second subline section 20B via the through hole 60T6, the conductor layer 612, and the through holes 61T6, 62T6, 63T6, 64T6, 65T6 and 66T6.

The capacitor C1B of the second matching section 30B is constituted by the conductor layers 522, 534, 542 and 554 shown in FIGS. 6B, 6C, 6D and 7A, the dielectric layer 52 interposed between the conductor layers 522 and 534, the dielectric layer 53 interposed between the conductor layers 534 and 542, and the dielectric layer 54 interposed between the conductor layers 542 and 554. The conductor layers 534 and 554 are connected to the conductor layer 712 constituting the third subline section 20C via the through holes 53T4, 54T4, 55T4, 56T4, 57T4, 58T4, 59T4, 60T4, 61T4, 62T4, 63T4, 64T4, 65T4, 66T4, 67T4, 68T4, 69T4 and 70T4.

The capacitor C2B of the second matching section 30B is constituted by the conductor layers 522, 533, 542 and 553 shown in FIGS. 6B, 6C, 6D and 7A, the dielectric layer 52 interposed between the conductor layers 522 and 533, the dielectric layer 53 interposed between the conductor layers 533 and 542, and the dielectric layer 54 interposed between the conductor layers 542 and 553. The conductor layers 533 and 553 are connected to the conductor layer 672 constituting the second subline section 20B via the through holes 53T2, 54T2, 55T2, 5612, 57T2, 58T2, 59T2, 60T2, 61T6, 6216, 63T6, 64T6, 65T6 and 66T6.

The inductor L2B of the second matching section 30B is constituted by the conductor layer 604 shown in FIG. 8B. The portion of the conductor layer 604 near the first end thereof is connected to the conductor layers 522 and 542 shown in FIGS. 6B and 6D via the through holes 59T9 and 58T9, the conductor layer 584, and the through holes 57T9, 56T9, 55T9, 54T9, 53T9 and 52T9. The portion of the conductor layer 604 near the second end thereof is connected to the conductor layer 621 shown in FIG. 8D via the through hole 60T9, the conductor layer 613, and the through hole 61T9.

In the stack 50, the ground conductor layer 641 connected to the ground is interposed between the conductor layer 691 constituting the main line 10 and the conductor layers constituting the first and second matching sections 30A and 30B. Thus, the first and second matching sections 30A and 30B are not configured to be electromagnetically coupled to the main line 10.

Figure 12:
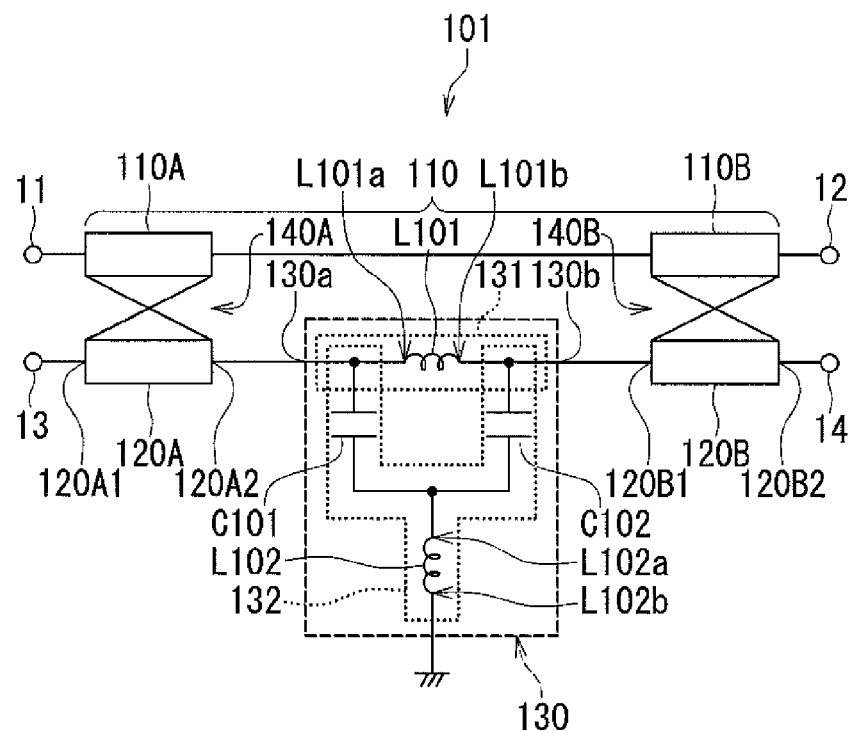
FIG. 12 is a circuit diagram illustrating the circuitry of a directional coupler of a first comparative example.

Now, the effects of the directional coupler 1 according to the first embodiment will be described in more detail in comparison with a directional coupler of a first comparative example. First, reference is made to FIG. 12 to describe the circuitry of the directional coupler 101 of the first comparative example. Like the directional coupler 1 according to the first embodiment, the directional coupler 101 of the first comparative example includes a first port 11, a second port 12, a third port 13, and a fourth port 14. The directional coupler 101 of the first comparative example further includes: a main line 110 connecting the first port 11 and the second port 12; a first subline section 120A and a second subline section 120B each of which is formed of a line configured to be electromagnetically coupled to the main line 110; and a matching section 130 provided between the first subline section 120A and the second subline section 120B. One of the third and fourth ports 13 and 14 is grounded via a terminator having a resistance of, for example, 50 Ω.

The first subline section 120A has a first end 120A1 and a second end 120A2 opposite to each other. The second subline section 120B has a first end 120B1 and a second end 120B2 opposite to each other. The matching section 130 has a first end 130a and a second end 130b opposite to each other. The first end 120A1 of the first subline section 120A is connected to the third port 13. The first end 130a of the matching section 130 is connected to the second end 120A2 of the first subline section 120A. The first end 120B1 of the second subline section 120B is connected to the second end 130b of the matching section 130. The second end 120B2 of the second subline section 120B is connected to the fourth port 14.

The matching section 130 includes a first path 131 connecting the first end 130a and the second end 130b, and a second path 132 connecting the first path 131 and the ground. The first path 131 includes a first inductor L101. The first inductor L101 has a first end L101a and a second end L101b opposite to each other.

The second path 132 includes a first capacitor C101 and a second inductor L102 connected in series. The second inductor L102 has a first end L102a and a second end L102b. In terms of circuitry, the first end L102a is closest to the first path 131, and the second end L102b is closest to the ground. The first capacitor C101 is provided between the first end L101a of the first inductor L101 and the first end L102a of the second inductor L102. The second path 132 further includes a second capacitor C102 provided between the second end L101b of the first inductor L101 and the first end L102a of the second inductor L102.

The main line 110 includes a first portion 110A configured to be electromagnetically coupled to the first subline section 120A, and a second portion 110B configured to be electromagnetically coupled to the second subline section 120B. A portion of the main line 110 to be coupled to the first subline section 120A, i.e., the first portion 110A, and the first subline section 120A in combination will be referred to as the first coupling section 140A. A portion of the main line 110 to be coupled to the second subline section 120B, i.e., the second portion 110B, and the second subline section 120B in combination will be referred to as the second coupling section 140B.

The strength of coupling of the first coupling section 140A and the strength of coupling of the second coupling section 140B will be defined as follows. The strength of coupling of the first coupling section 140A is the strength of coupling of the first subline section 120A to the first portion 110A of the main line 110. Specifically, the strength of coupling of the first coupling section 140A is expressed in terms of a ratio of the power of a high frequency signal appearing on the first sublime section 120A to the power of a high frequency signal supplied to the first portion 110A. The strength of coupling of the second coupling section 140B is the strength of coupling of the second subline section 120B to the second portion 110B of the main line 110. Specifically, the strength of coupling of the second coupling section 140B is expressed in terms of a ratio of the power of a high frequency signal appearing on the second subline section 120B to the power of a high frequency signal supplied to the second portion 110B. The strength of coupling of the second coupling section 140B is higher than the strength of coupling of the first coupling section 140A.

The matching section 130 is a circuit for performing impedance matching between a signal source and a load, assuming a situation in which one of the third and fourth ports 13 and 14 is grounded via a terminator serving as the load, and the other of the third and fourth ports 13 and 14 is connected with the signal source having an output impedance equal to the resistance of the terminator (e.g., 50 Ω). On the assumption of the above situation, the matching section 130 is designed so that the reflection coefficient as viewed in the direction from one of the third and fourth ports 13 and 14 to the other has an absolute value of zero or near zero in the service frequency band of the directional coupler 101 of the first comparative example. The matching section 130 causes a change in the phase of a signal passing therethrough.

Figure 13:
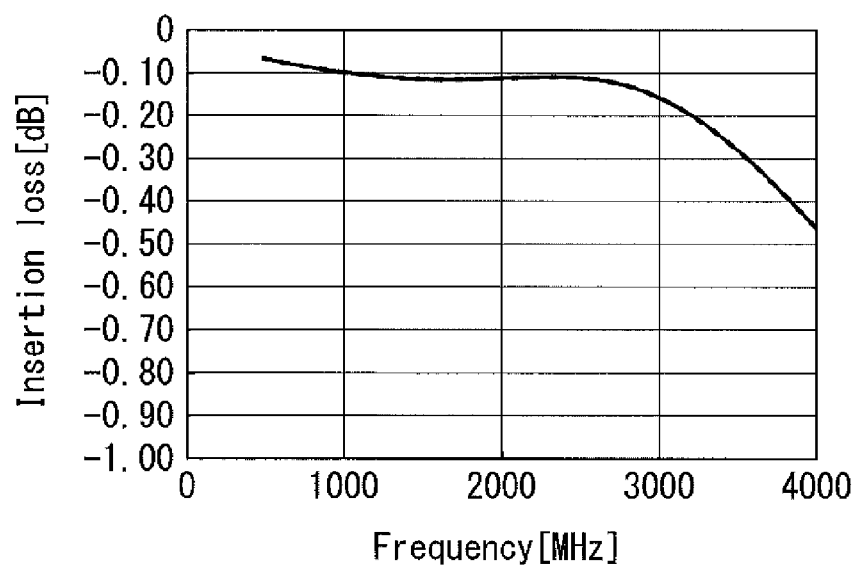
FIG. 13 is a characteristic diagram illustrating the frequency response of the insertion loss of the directional coupler of the first comparative example.

Reference is now made to FIG. 13 to FIG. 16 to describe the characteristics of the directional coupler 101 of the first comparative example when used in the first and second modes of use described previously. FIG. 13 is a characteristic diagram illustrating the frequency response of the insertion loss of the directional coupler 101 of the first comparative example. In FIG. 13, the horizontal axis represents frequency, and the vertical axis represents insertion loss. In FIG. 13, the solid curve represents the insertion loss of the directional coupler 101 when used in the first mode of use, that is, the insertion loss of the directional coupler 101 when a high frequency signal is received at the first port 11; the dashed curve represents the insertion loss of the directional coupler 101 when used in the second mode of use, that is, the insertion loss of the directional coupler 101 when a high frequency signal is received at the second port 12. In FIG. 13 the solid curve and the dashed curve coincide with each other.

Figure 14:
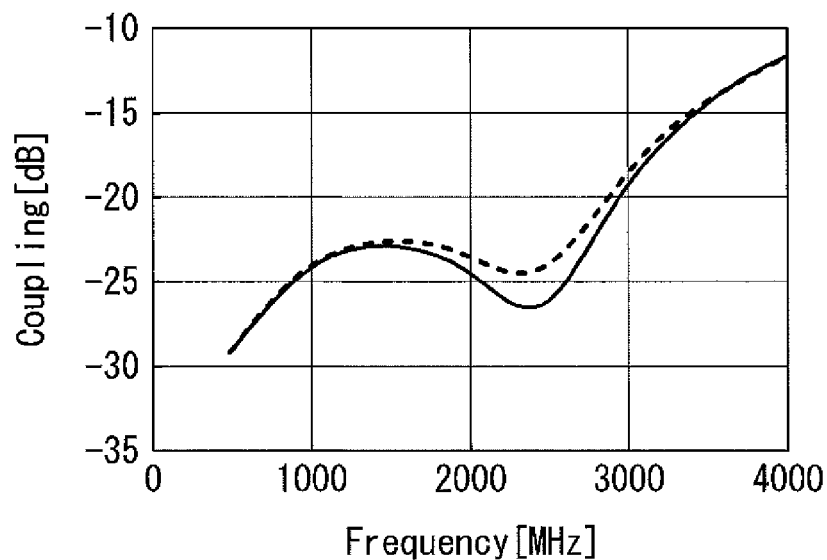
FIG. 14 is a characteristic diagram illustrating the frequency response of the coupling of the directional coupler of the first comparative example.

FIG. 14 is a characteristic diagram illustrating the frequency response of the coupling of the directional coupler 101 of the first comparative example. In FIG. 14, the horizontal axis represents frequency, and the vertical axis represents coupling. In FIG. 14, the solid curve represents the coupling of the directional coupler 101 when used in the first mode of use; the dashed curve represents the coupling of the directional coupler 101 when used in the second mode of use.

Figure 15:
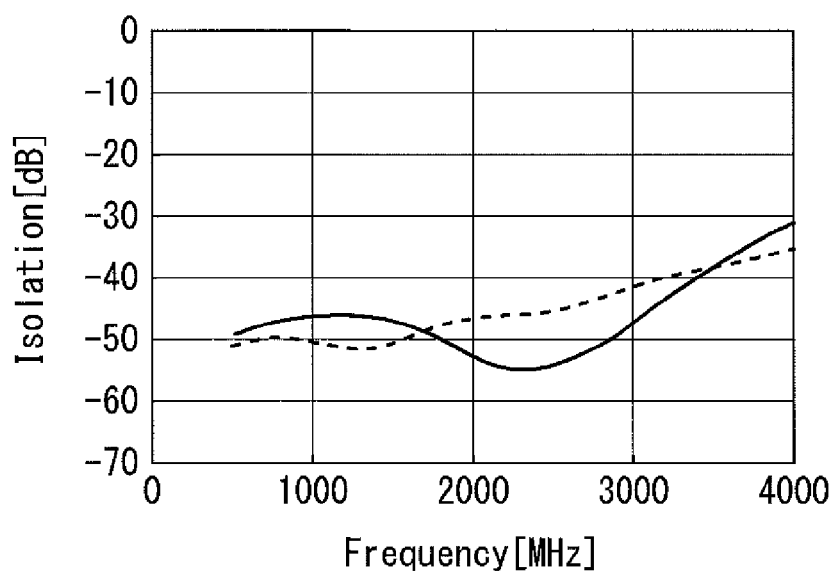
FIG. 15 is a characteristic diagram illustrating the frequency response of the isolation of the directional coupler of the first comparative example.

FIG. 15 is a characteristic diagram illustrating the frequency response of the isolation of the directional coupler 101 of the first comparative example. In FIG. 15, the horizontal axis represents frequency, and the vertical axis represents isolation. In FIG. 15, the solid curve represents the isolation of the directional coupler 101 when used in the first mode of use; the dashed curve represents the isolation of the directional coupler 101 when used in the second mode of use.

Figure 16:
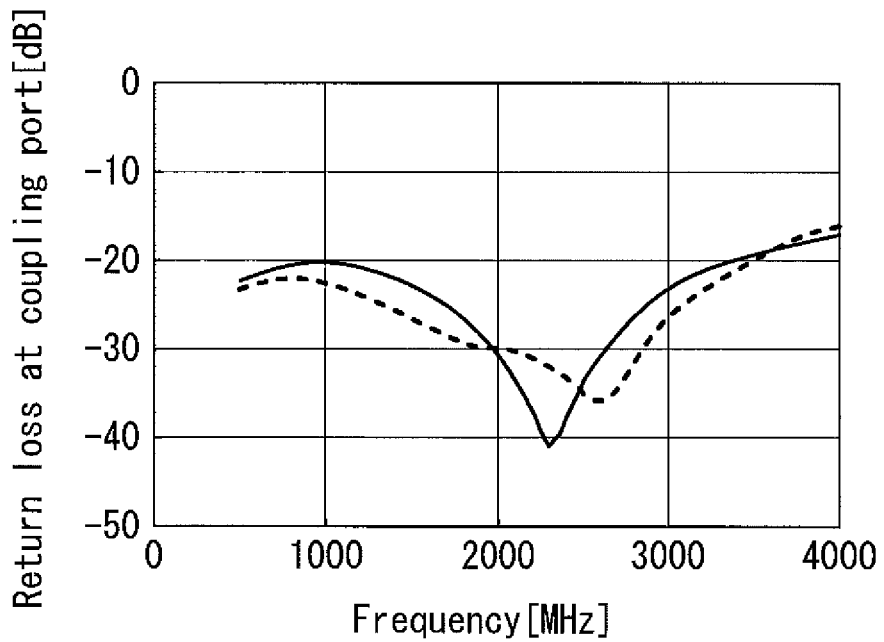
FIG. 16 is a characteristic diagram illustrating the frequency response of the return loss at the coupling port of the directional coupler of the first comparative example.

FIG. 16 is a characteristic diagram illustrating the frequency response of the return loss at the coupling port of the directional coupler 101 of the first comparative example. In FIG. 16, the horizontal axis represents frequency, and the vertical axis represents return loss at the coupling port. In FIG. 16, the solid curve represents the return loss at the coupling port, i.e., the third port 13, of the directional coupler 101 when used in the first mode of use; the dashed curve represents the return loss at the coupling port, i.e., the fourth port 14, of the directional coupler 101 when used in the second mode of use.

As shown in FIG. 14 to FIG. 16, the frequency response of the coupling, the frequency response of the isolation, and the frequency response of the return loss at the coupling port of the directional coupler 101 of the first comparative example when used in the first mode of use are different from those of the directional coupler 101 when used in the second mode of use.

Figure 17:
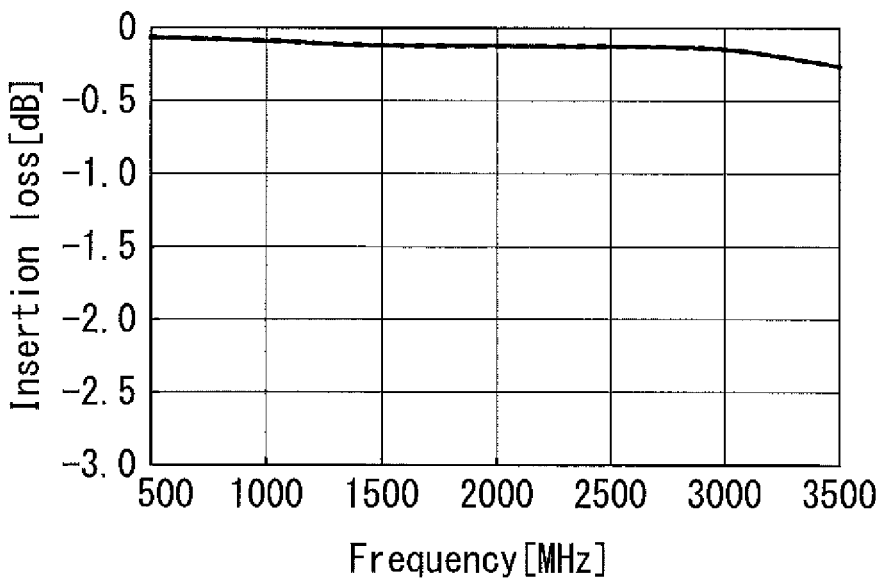
FIG. 17 is a characteristic diagram illustrating the frequency response of the insertion loss of the directional coupler according to the first embodiment of the invention.

Reference is now made to FIG. 17 to FIG. 22 to describe an example of characteristics of the directional coupler 1 according to the first embodiment when used in the first and second modes of use. FIG. 17 is a characteristic diagram illustrating the frequency response of the insertion loss of the directional coupler 1. In FIG. 17, the horizontal axis represents frequency, and the vertical axis represents insertion loss. In FIG. 17, the solid curve represents the insertion loss of the directional coupler 1 when used in the first mode of use, that is, the insertion loss of the directional coupler 1 when a high frequency signal is received at the first port 11; the dashed curve represents the insertion loss of the directional coupler 1 when used in the second mode of use, that is, the insertion loss of the directional coupler 1 when a high frequency signal is received at the second port 12. In FIG. 17 the solid curve and the dashed curve coincide with each other. If we let −x (dB) denote the insertion loss, FIG. 17 indicates that the directional coupler 1, regardless of whether used in the first mode of use or the second mode of use, exhibits a sufficiently small value of x, that is, 0.2 or smaller, in the 500- to 3000-MHz frequency band.

Figure 18:
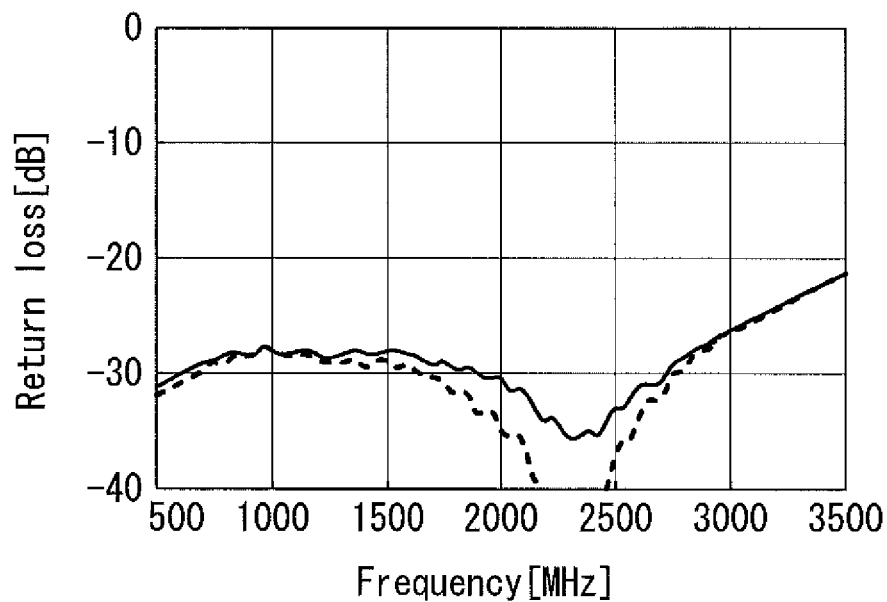
FIG. 18 is a characteristic diagram illustrating the frequency response of the return loss at the input port of the directional coupler according to the first embodiment of the invention.

FIG. 18 is a characteristic diagram illustrating the frequency response of the return loss at the input port of the directional coupler 1. In FIG. 18, the horizontal axis represents frequency, and the vertical axis represents return loss. In FIG. 18, the solid curve represents the return loss at the input port, i.e., the first port 11, of the directional coupler 1 when used in the first mode of use; the dashed curve represents the return loss at the input port, i.e., the second port 12, of the directional coupler 1 when used in the second mode of use.

Figure 19:
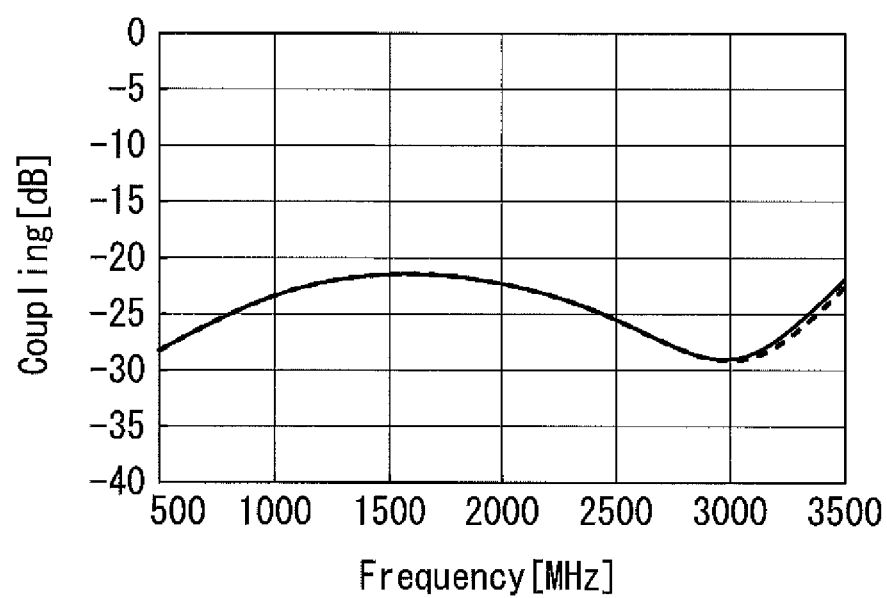
FIG. 19 is a characteristic diagram illustrating the frequency response of the coupling of the directional coupler according to the first embodiment of the invention.

FIG. 19 is a characteristic diagram illustrating the frequency response of the coupling of the directional coupler 1. In FIG. 19, the horizontal axis represents frequency, and the vertical axis represents coupling. In FIG. 19, the solid curve represents the coupling of the directional coupler 1 when used in the first mode of use; the dashed curve represents the coupling of the directional coupler 1 when used in the second mode of use. FIG. 19 indicates that the directional coupler 1, regardless of whether used in the first mode of use or the second mode of use, exhibits a sufficiently small change in the coupling in response to a change in frequency in the 500- to 3500-MHz frequency band. Further, if we let −c (dB) denote the coupling, the directional coupler 1, regardless of whether used in the first mode of use or the second mode of use, exhibits a sufficiently large value of c, that is, 20 or above, in the 500- to 3000-MHz frequency band.

Figure 20:
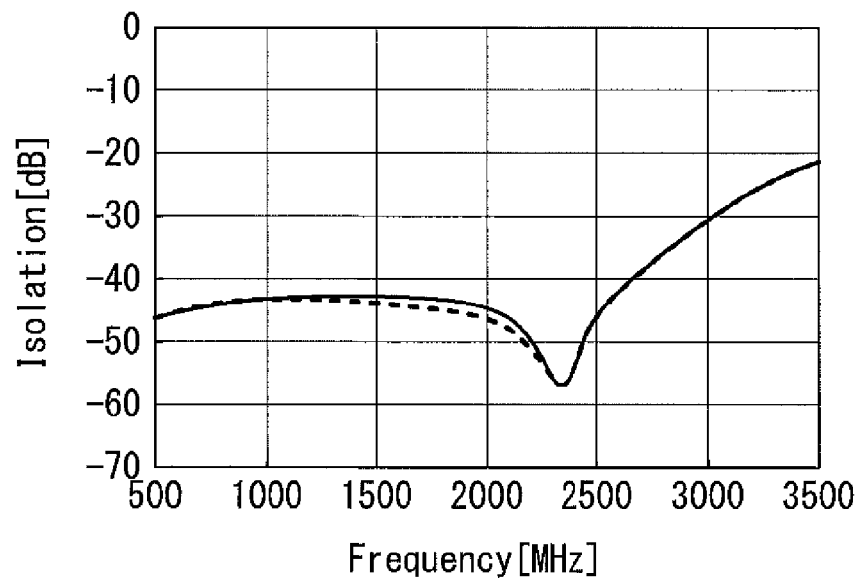
FIG. 20 is a characteristic diagram illustrating the frequency response of the isolation of the directional coupler according to the first embodiment of the invention.

FIG. 20 is a characteristic diagram illustrating the frequency response of the isolation of the directional coupler 1. In FIG. 20, the horizontal axis represents frequency, and the vertical axis represents isolation. In FIG. 20, the solid curve represents the isolation of the directional coupler 1 when used in the first mode of use; the dashed curve represents the isolation of the directional coupler 1 when used in the second mode of use. FIG. 20 indicates that the directional coupler 1, regardless of whether used in the first mode of use or the second mode of use, exhibits a sufficiently small change in the isolation in response to a change in frequency in the 500- to 3000-MHz frequency band. Further, if we let −i (dB) denote the isolation, the directional coupler 1, regardless of whether used in the first mode of use or the second mode of use, exhibits a sufficiently large value of i, that is, 30 or above, in the 500- to 3000-MHz frequency band.

Figure 21:
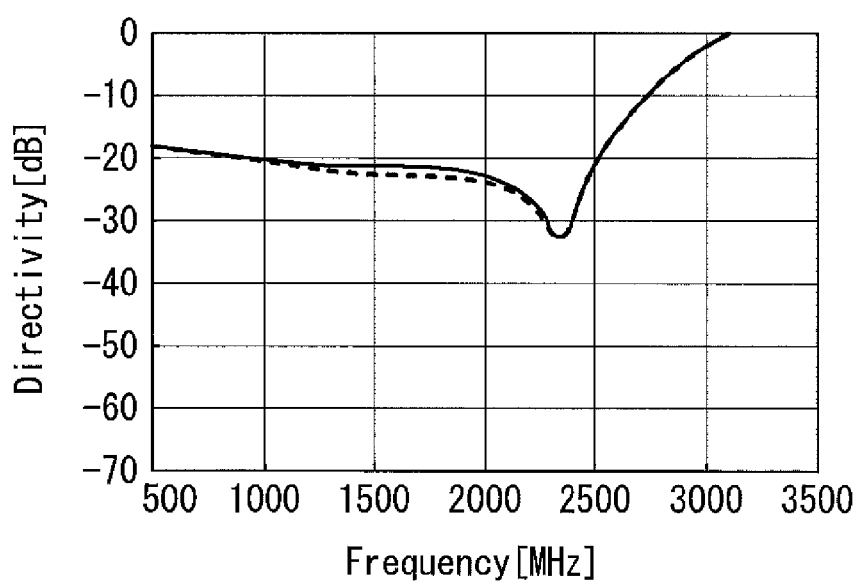
FIG. 21 is a characteristic diagram illustrating the frequency response of the directivity of the directional coupler according to the first embodiment of the invention.

FIG. 21 is a characteristic diagram illustrating the frequency response of the directivity of the directional coupler 1. In FIG. 21, the horizontal axis represents frequency, and the vertical axis represents directivity. In FIG. 21, the solid curve represents the directivity of the directional coupler 1 when used in the first mode of use; the dashed curve represents the directivity of the directional coupler 1 when used in the second mode of use.

Figure 22:
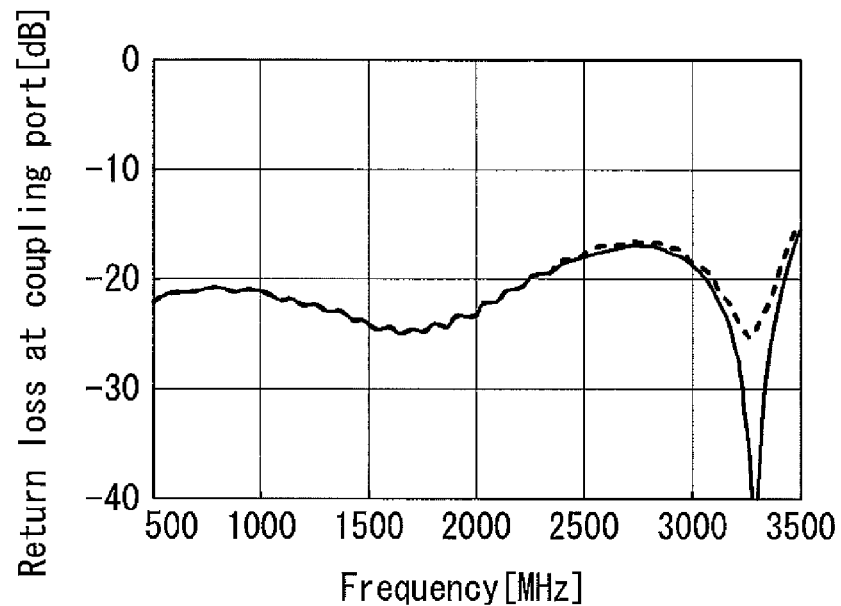
FIG. 22 is a characteristic diagram illustrating the frequency response of the return loss at the coupling port of the directional coupler according to the first embodiment of the invention.

FIG. 22 is a characteristic diagram illustrating the frequency response of the return loss at the coupling port of the directional coupler 1. In FIG. 22, the horizontal axis represents frequency, and the vertical axis represents return loss at the coupling port. In FIG. 22, the solid curve represents the return loss at the coupling port, i.e., the third port 13, of the directional coupler 1 when used in the first mode of use; the dashed curve represents the return loss at the coupling port, i.e., the fourth port 14, of the directional coupler 1 when used in the second mode of use. If we let −r (dB) denote the return loss at the coupling port, the directional coupler 1, regardless of whether used in the first mode of use or the second mode of use, exhibits a sufficiently large value of r, that is, 15 or above, in the 500- to 3500-MHz frequency band. This means that the reflection coefficient as viewed in the direction from one of the third and fourth ports 13 and 14 to the other has an absolute value of zero or near zero in the 500- to 3500-MHz frequency band.

The directional coupler 1 having the characteristics illustrated in FIG. 17 to FIG. 22 is usable in a wide frequency band of at least 500 to 3000 MHz. Thus, the service frequency band of the directional coupler 1 shall be 500 to 3000 MHz, for example.

As shown in FIG. 17 to FIG. 22, there is no difference or hardly any difference in any of the frequency response of the insertion loss, the frequency response of the reflection loss at the input port, the frequency response of the coupling, the frequency response of the isolation, the frequency response of the directivity, and the frequency response of the reflection loss at the coupling port of the directional coupler 1 according to the first embodiment between the cases of the first mode of use and the second mode of use. It should be noted that the frequency response of the return loss at the input port shown in FIG. 18 and the frequency response of the return loss at the coupling port shown in FIG. 22 each include a portion in which the magnitude of the return loss differs between the cases of the first mode of use and the second mode of use. This difference in the magnitude of the return loss is an error resulting from manufacturing variances of the directional coupler 1. In each of FIG. 18 and FIG. 22, the return loss is in the unit of dB. Thus, the difference in the magnitude of the return loss is very slight.

As has been described, the directional coupler 1 according to the first embodiment is able to reduce a change in the coupling in response to a change in the frequency of a signal received at the directional coupler 1 over a wide frequency band and provides the same characteristics regardless of whether used in the first mode of use or the second mode of use. The directional coupler 1 according to the first embodiment is usable for multiple signals in multiple frequency bands used in CA, for example.

The second inductor L2A in the first matching section 30A and the second inductor L2B in the second matching section 30B both have an inductance of 0.1 nH or higher. Typically, in a stack that is used to form an electronic component and includes a plurality of stacked dielectric layers and conductor layers, any conductor layer connected to the ground has a stray inductance lower than 0.1 nH. The inductance of each of the second inductors L2A and L2B, which is 0.1 nH or higher, is thus clearly distinguishable from the stray inductance.

Now, let us contemplate a directional coupler of a second comparative example provided with a low-pass filter such as one disclosed in U.S. Pat. No. 9,077,061 B2, in place of the first and second matching sections 30A and 30B of the first embodiment. The directional coupler of the second comparative example does not work in a frequency band not lower than the cut-off frequency of the low-pass filter. The reason is that, in the frequency band not lower than the cut-off frequency of the low-pass filter, most part of the signal received at the low-pass filter flows to the ground and fails to pass through the low-pass filter. Thus, the directional coupler of the second comparative example is not usable over a wide band.

The first and second matching sections 30A and 30B of the directional coupler I according to the first embodiment are capable of passing high frequency signals over a wider frequency band when compared with low-pass filters.

Further, the directional coupler 1 according to the first embodiment does not require a line having a length of a quarter or more of the wavelength of a high frequency signal, such as one disclosed in JP 2014-057207A. The first embodiment thus allows for a reduction in the footprint of the directional coupler 1. In the directional coupler 1, the first matching section 30A includes the inductors L1A and L2A and the capacitors C1A and C2A; the second matching section 30B includes the inductors L1B and L2B and the capacitors C1B and C2B. Each of the inductors L1A, L2A, L1B and L2B is formed using one or more conductor layers among the plurality of conductor layers of the stack 50. Each of the capacitors C1A, C2A, C1B and C2B is formed using two or more conductor layers among the plurality of conductor layers of the stack 50. Thus, in the first embodiment, the first and second matching sections 30A and 30B are formed using the stack 50. This allows for a reduction in the footprint of the first and second matching sections 30A and 30B.

By virtue of the foregoing, the first embodiment allows the directional coupler 1 to be wideband capable and bidirectional, and have a reduced footprint.

In the first embodiment, the circuitry of the directional coupling 1 may be asymmetric if the degree of asymmetry is within an acceptable range. Even in such a case, the directional coupler 1 is wideband capable and bidirectional, and has a reduced footprint.

Second Embodiment

Figure 23:
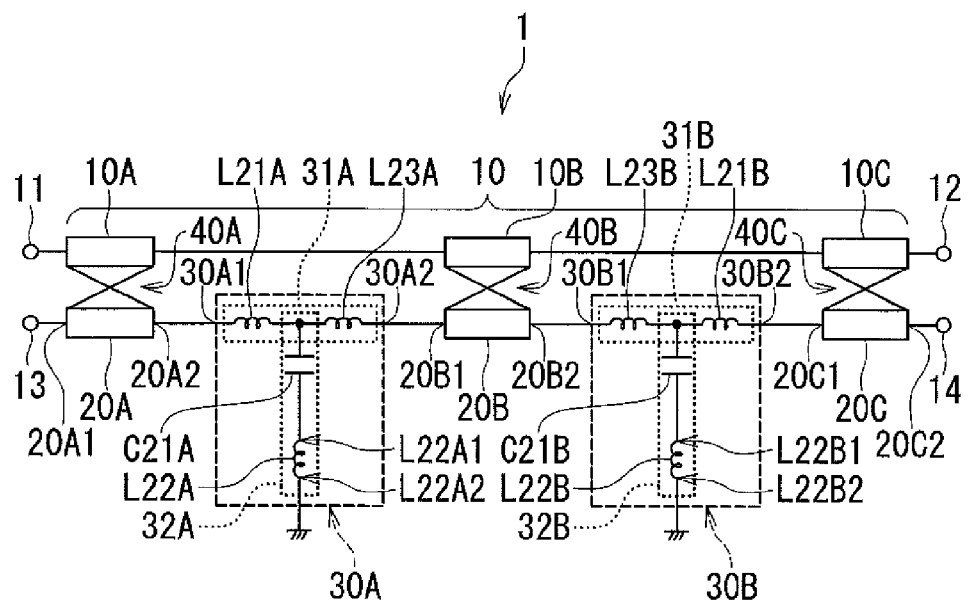
FIG. 23 is a circuit diagram illustrating the circuitry of a directional coupler according to a second embodiment of the invention.

A directional coupler 1 according to a second embodiment of the invention will now be described with reference to FIG. 23. FIG. 23 is a circuit diagram illustrating the circuitry of the directional coupler 1 according to the second embodiment. In the directional coupler 1 according to the second embodiment, the first and second matching sections 30A and 30B are configured differently than in the first embodiment.

The first matching section 30A in the second embodiment includes a first path 31A connecting the first end 30A1 and the second end 30A2, and a second path 32A connecting the first path 31A and the ground, as in the first embodiment. The first path 31A includes a first inductor L21A, and a third inductor L23A connected to the first inductor L21A in series.

FIG. 23 illustrates an example in which one end of the first inductor L21A is connected to the second end 20A2 of the first subline section 20A, one end of the third inductor L23A is connected to the first end 20B1 of the second subline section 20B, and the respective other ends of the first inductor L21A and the third inductor L23A are connected to each other. In the second embodiment, however, the locations of the first inductor L21A and the third inductor L23A may be reversed from those in the example shown in FIG. 23.

The second path 32A includes a first capacitor C21A and a second inductor L22A connected in series. The second inductor L22A has a first end L22A1 and a second end L22A2. In terms of circuitry, the first end L22A1 is closest to the first path 31A, and the second end L22A2 is closest to the ground. The first capacitor C21A is provided between the first end L22A1 of the second inductor L22A and the connection point between the first inductor L21A and the third inductor L23A. The second inductor L22A has an inductance of 0.1 nH or higher. The inductance of the second inductor L22A is preferably not higher than 7 nH.

The second matching section 30B in the second embodiment includes a first path 31B connecting the first end 30B1 and the second end 30B2, and a second path 32B connecting the first path 31B and the ground, as in the first embodiment. The first path 31B includes a first inductor L21B, and a third inductor L23B connected to the first inductor L21B in series.

FIG. 23 illustrates an example in which one end of the first inductor L21B is connected to the first end 20C1 of the third subline section 20C, one end of the third inductor L23B is connected to the second end 20B2 of the second subline section 20B, and the respective other ends of the first inductor L21B and the third inductor L23B are connected to each other. In the second embodiment, however, when the locations of the first inductor L21A and the third inductor L23A in the first matching section 30A are reversed from those in the example shown in FIG. 23, the locations of the first inductor L21B and the third inductor L23B in the second matching section 30B are also reversed from those in the example shown in FIG. 23.

The second path 32B includes a first capacitor C21B and a second inductor L22B connected in series. The second inductor L22B has a first end L22B1 and a second end L22B2. In terms of circuitry, the first end L22B1 is closest to the first path 31B, and the second end L22B2 is closest to the ground. The first capacitor C21B is provided between the first end L22B1 of the second inductor L22B and the connection point between the first inductor L21B and the third inductor L23B. The second inductor L22B has an inductance of 0.1 nH or higher. The inductance of the second inductor L22B is preferably not higher than 7 nH.

Although not illustrated, the directional coupler 1 according to the second embodiment includes the stack 50 for integrating the first to fourth ports 11 to 14, the main line 10, the first to third subline sections 20A, 20B and 20C, and the first and second matching sections 30A and 30B, like the first embodiment. The stack 50 includes a plurality of dielectric layers and and a plurality of conductor layers stacked on each other. Each of the inductors L21A, L22A, L23A, L21B, L22B and L23B is formed using one or more conductor layers among the plurality of conductor layers of the stack 50. Each of the capacitors C21A and C21B is formed using two or more conductor layers among the plurality of conductor layers of the stack 50.

In the following, we discuss the case where the circuitry of the directional coupler 1 is symmetric. In this case, the strength of coupling of the third coupling section 40C is equal to the strength of coupling of the first coupling section 40A. Further, the circuitry of the first matching section 30A and that of the second matching section 30B, including element values, are mutually symmetric with respect to the second coupling section 40B. More specifically, the inductances of the first inductors L21A and L21B pairing up with each other are substantially equal to each other; the inductances of the second inductors L22A and L22B pairing up with each other are substantially equal to each other; the inductances of the third inductors L23A and L23B pairing up with each other are substantially equal to each other; and the capacitances of the first capacitors C21A and C21B pairing up with each other are substantially equal to each other. When signals of the same frequency pass through the first and second matching sections 30A and 30B, the first and second matching sections 30A and 30B cause changes of the same magnitude in the phase of those signals. The directional coupler 1 is bidirectional because the circuitry thereof is symmetric with respect to the second coupling section 40B.

The first and second matching sections 30A and 30B of the second embodiment have functions similar to those of the first and second matching sections 30A and 30B of the first embodiment. The remainder of configuration, operation and effects of the second embodiment are similar to those of the first embodiment. In the second embodiment, as in the first embodiment, the circuitry of the directional coupling 1 may be asymmetric if the degree of asymmetry is within an acceptable range. Even in such a case, the directional coupler 1 is wideband capable and bidirectional, and has a reduced footprint.

The present invention is not limited to the foregoing embodiments, and various modifications may be made thereto. For example, the configuration of each of the first and second matching sections of the present invention is not limited to that illustrated in each embodiment, and can be modified in various ways as far as the requirements of the appended claims are met.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A directional coupler comprising:
a first port;
a second port;
a third port;
a fourth port;
a main line connecting the first port and the second port;
a first subline section, a second subline section and a third sublime section each of which is formed of a line configured to be electromagnetically coupled to the main line;
a first matching section; and
a second matching section, wherein
the first to third subline sections and the first and second matching sections each have a first end and a second end opposite to each other,
the first end of the first subline section is connected to the third port,
the first end of the first matching section is connected to the second end of the first subline section,
the first end of the second subline section is connected to the second end of the first matching section,
the first end of the second matching section is connected to the second end of the second subline section,
the first end of the third subline section is connected to the second end of the second matching section,
the second end of the third subline section is connected to the fourth port, each of the first and second matching sections causes a change in phase of a signal passing therethrough,
each of the first and second matching sections includes a first path connecting the first end and the second end of the matching section, and a second path connecting the first path and a ground,
the first path includes a first inductor, and
the second path includes a first capacitor and a second inductor connected in series.

2. The directional coupler according to claim 1, further comprising a stack for integrating the first to fourth ports, the main line, the first to third sublines, and the first and second matching sections, wherein the stack includes a plurality of dielectric layers and a plurality of conductor layers stacked on each other, each of the first and second inductors is formed using one or more conductor layers among the plurality of conductor layers, and the first capacitor is formed using two or more conductor layers among the plurality of conductor layers.

3. The directional coupler according to claim 1, wherein a strength of coupling of the second subline section to the main line is higher than a strength of coupling of the first subline section to the main line and a strength of coupling of the third subline section to the main line.

4. The directional coupler according to claim 1, wherein
the first inductor has a first end and a second end opposite to each other, the second inductor has a first end and a second end, the first end being closest to the first path in terms of circuitry, the second end being closest to the ground in terms of circuitry, the first capacitor is provided between the first end of the first inductor and the first end of the second inductor, and the second path further includes a second capacitor provided between the second end of the first inductor and the first end of the second inductor.

5. The directional coupler according to claim 1, wherein
the first path further includes a third inductor connected to the first inductor in series, the second inductor has a first end and a second end, the first end being closest to the first path in terms of circuitry, the second end being closest to the ground in terms of circuitry, and the first capacitor is provided between the first end of the second inductor and a connection point between the first inductor and the third inductor.

6. The directional coupler according to claim 1, wherein the second inductor has an inductance of 0.1 nH or higher.

* * * * *